United States Patent
Yasuda et al.

(10) Patent No.: US 10,636,996 B2
(45) Date of Patent: Apr. 28, 2020

(54) DISPLAY DEVICE, PRODUCTION METHOD OF DISPLAY DEVICE, PRODUCTION DEVICE OF DISPLAY DEVICE, AND FILM FORMATION DEVICE

(71) Applicant: Sharp Kabushiki Kaisha, Sakai, Osaka (JP)

(72) Inventors: Yuki Yasuda, Sakai (JP); Katsuyuki Suga, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 23 days.

(21) Appl. No.: 16/066,707

(22) PCT Filed: Mar. 29, 2017

(86) PCT No.: PCT/JP2017/013012
§ 371 (c)(1),
(2) Date: Jun. 28, 2018

(87) PCT Pub. No.: WO2018/179168
PCT Pub. Date: Oct. 4, 2018

(65) Prior Publication Data
US 2019/0363284 A1    Nov. 28, 2019

(51) Int. Cl.
*H01L 51/52* (2006.01)
*H01L 27/32* (2006.01)
*H01L 51/00* (2006.01)

(52) U.S. Cl.
CPC ...... *H01L 51/5246* (2013.01); *H01L 27/3246* (2013.01); *H01L 51/0097* (2013.01); *H01L 51/5253* (2013.01)

(58) Field of Classification Search
CPC ............ H01L 51/5246; H01L 51/5253; H01L 51/0097; H01L 27/3246
See application file for complete search history.

(56) References Cited

U.S. PATENT DOCUMENTS

| | | |
|---|---|---|
| 2007/0080356 A1 | 4/2007 | Nakayama et al. |
| 2007/0158656 A1 | 7/2007 | Lee et al. |
| 2011/0001146 A1 | 1/2011 | Yamazaki et al. |
| 2015/0255739 A1 | 9/2015 | Kim et al. |
| 2016/0126493 A1 | 5/2016 | Yamazaki et al. |

FOREIGN PATENT DOCUMENTS

| | | |
|---|---|---|
| JP | 2002-55219 A | 2/2002 |
| JP | 2007-52966 A | 3/2007 |
| JP | 2007-164194 A | 6/2007 |
| JP | 2009-237508 A | 10/2009 |
| JP | 2011-29176 A | 2/2011 |
| JP | 2014-239045 A | 12/2014 |
| JP | 2015-194642 A | 11/2015 |

OTHER PUBLICATIONS

Official Communication issued in International Patent Application No. PCT/JP2017/013012, dated Jul. 4, 2017.

*Primary Examiner* — Seahvosh Nikmanesh
(74) *Attorney, Agent, or Firm* — Keating & Bennett, LLP

(57) ABSTRACT

A display device includes: a support material; a TFT layer that includes a plurality of inorganic insulating films; a light emitting element layer; and a sealing layer. A slit pattern that penetrates through the plurality of inorganic insulating films is formed, in a plan view, outside a display region and inside edges of the support material.

20 Claims, 19 Drawing Sheets

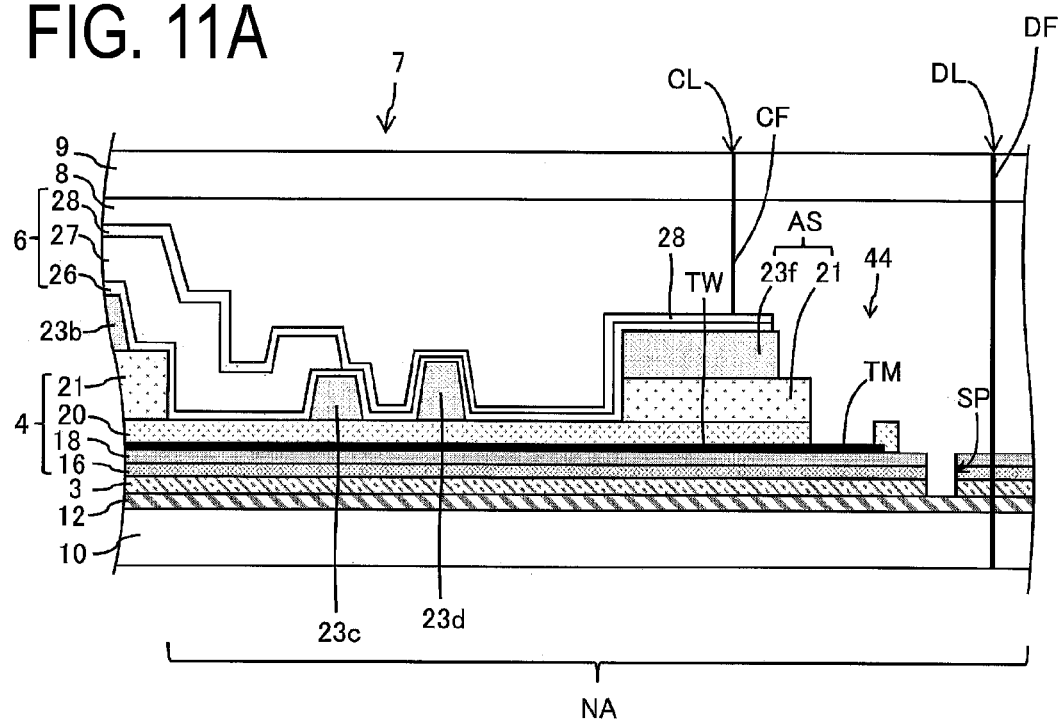
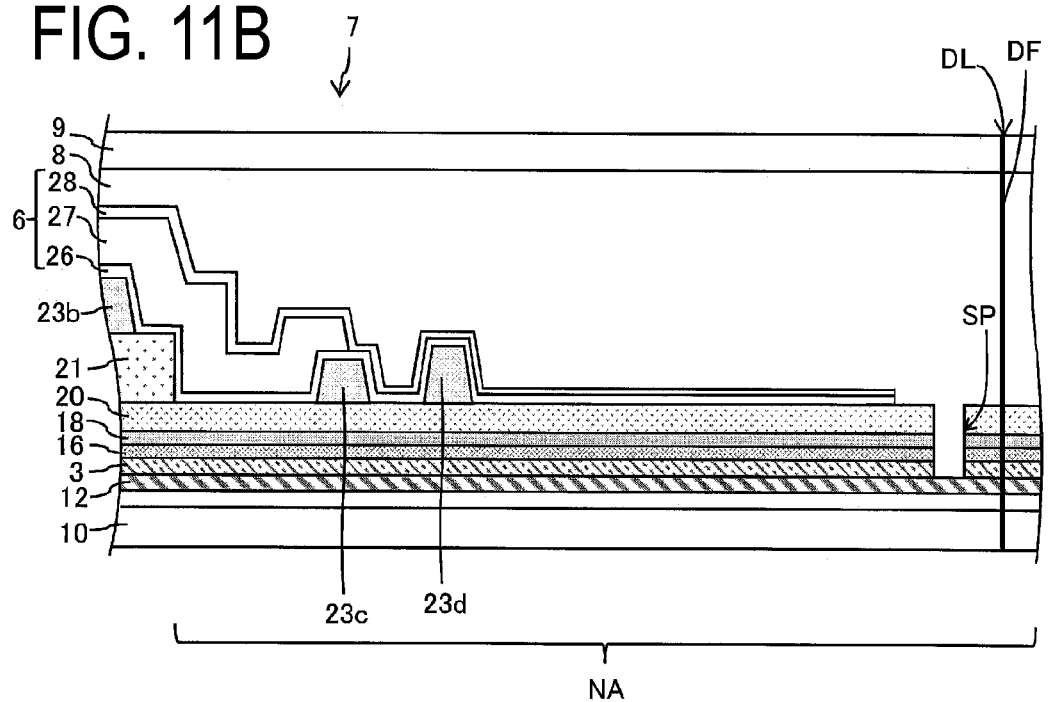

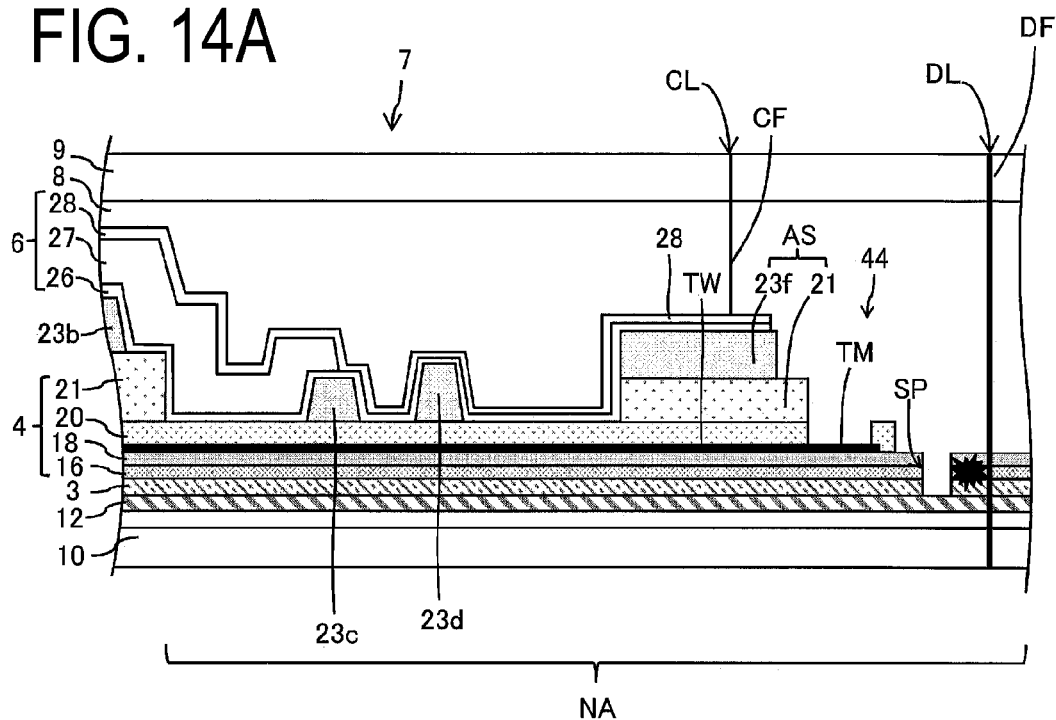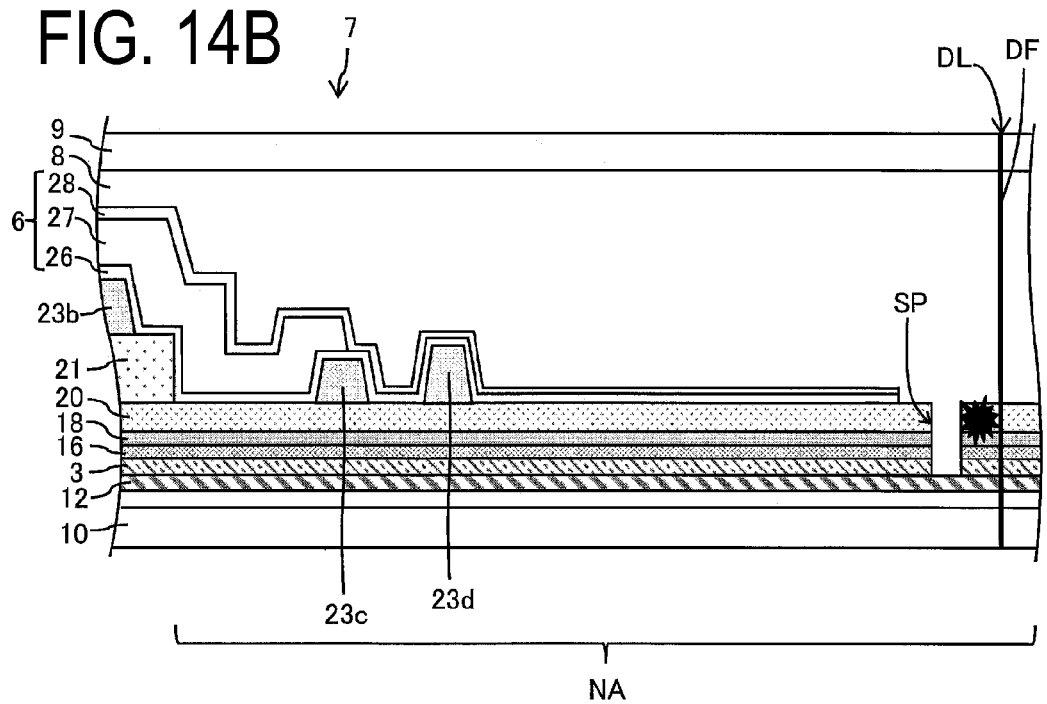

DISPLAY DEVICE, PRODUCTION METHOD OF DISPLAY DEVICE, PRODUCTION DEVICE OF DISPLAY DEVICE, AND FILM FORMATION DEVICE

TECHNICAL FIELD

The disclosure relates to a display device.

BACKGROUND ART

When a display device including EL elements is produced, a layered body, which is formed on a mother substrate and includes a TFT layer, a light emitting element layer, a sealing layer, and the like, is partitioned to obtain a plurality of display devices (individual pieces).

CITATION LIST

Patent Literature

PTL 1: JP 2015-194642A (published Nov. 5, 2015)

SUMMARY

Technical Problem

Performance of a display device may deteriorate due to cracking and the like in partition sections.

Solution to Problem

A display device according to an aspect of the disclosure is a display device including a TFT layer including a plurality of inorganic insulating films, a light emitting element layer, and a sealing layer disposed above a support material, wherein a slit pattern that penetrates through at least one of the plurality of inorganic insulating films is formed, in a plan view, outside a display region and inside edges of the support material.

Advantageous Effects of Disclosure

According to an aspect of the disclosure, performance of a display device can be secured.

BRIEF DESCRIPTION OF DRAWINGS

FIG. 11A is a cross-sectional view illustrating an X region of FIG. 10, and FIG. 11B is a cross-sectional view illustrating a Y region of FIG. 10.

FIGS. 14A and 14B are cross-sectional views illustrating an advantage of the second embodiment.

DESCRIPTION OF EMBODIMENTS

Figure 1:
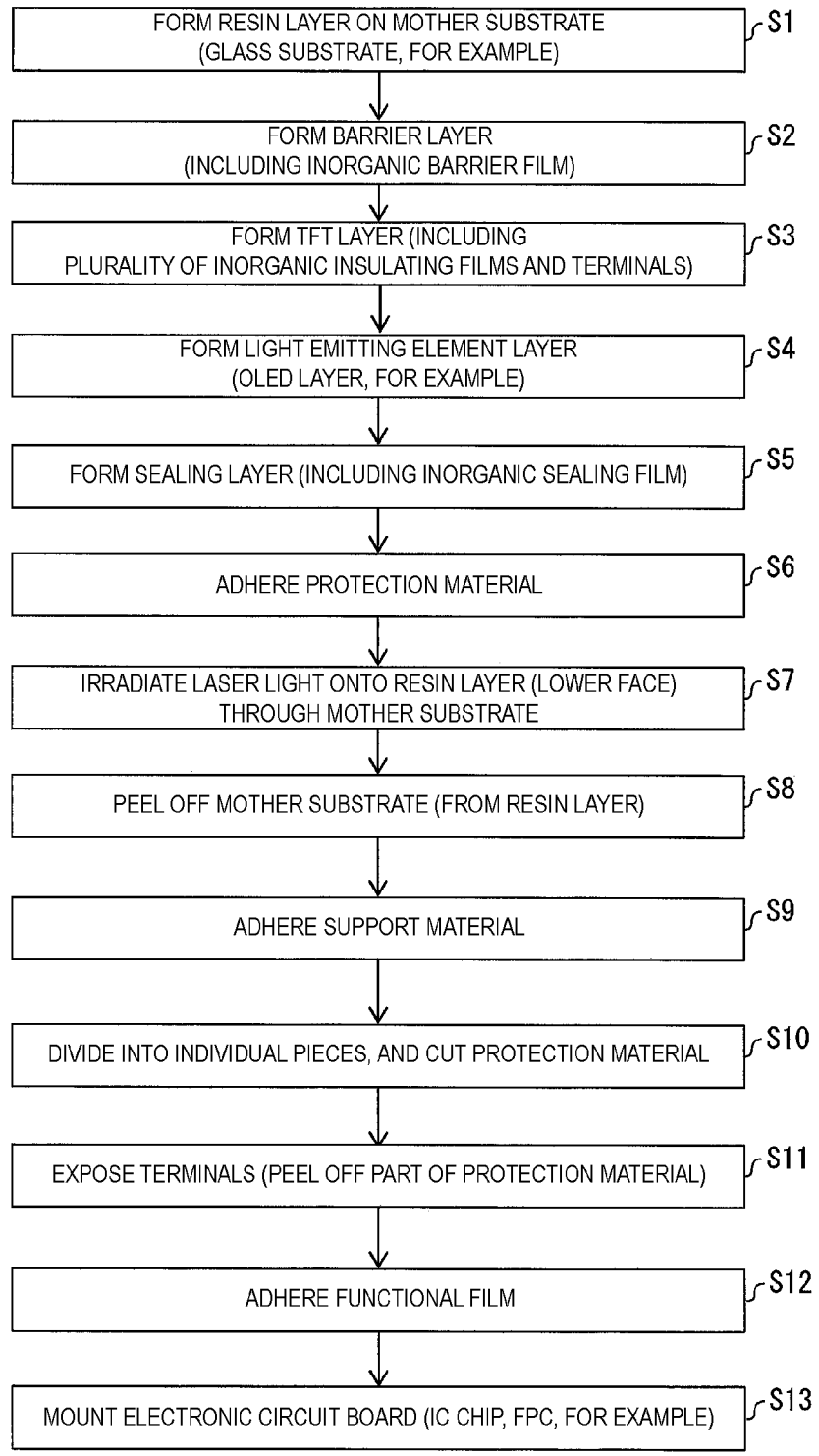
FIG. 1 is a flowchart illustrating an example of a production method of a display device.
Figure 2A:
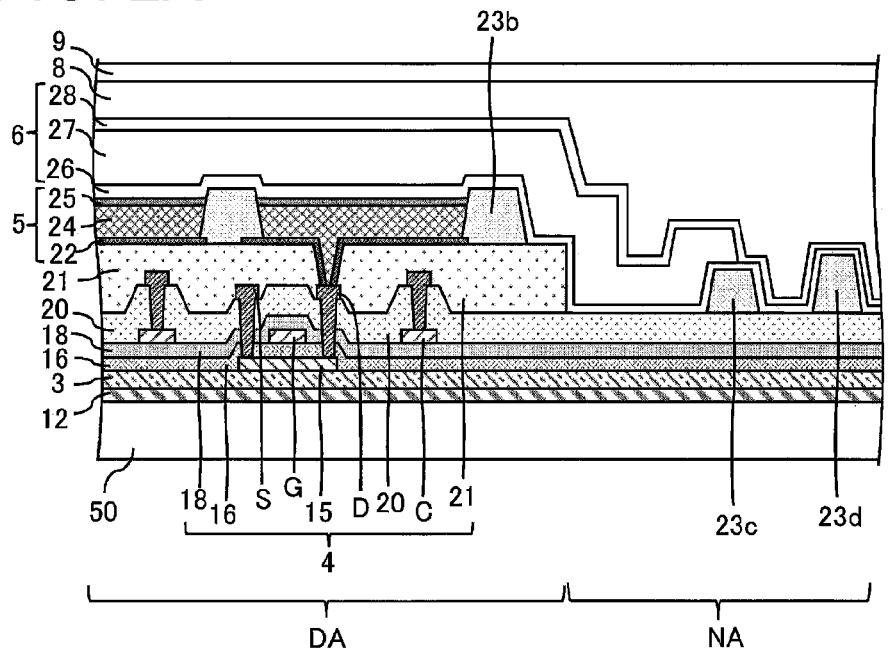
FIGS. 2A and 2B are cross-sectional views illustrating a configuration example (display region) of the display device of a present embodiment during formation.
Figure 2B:
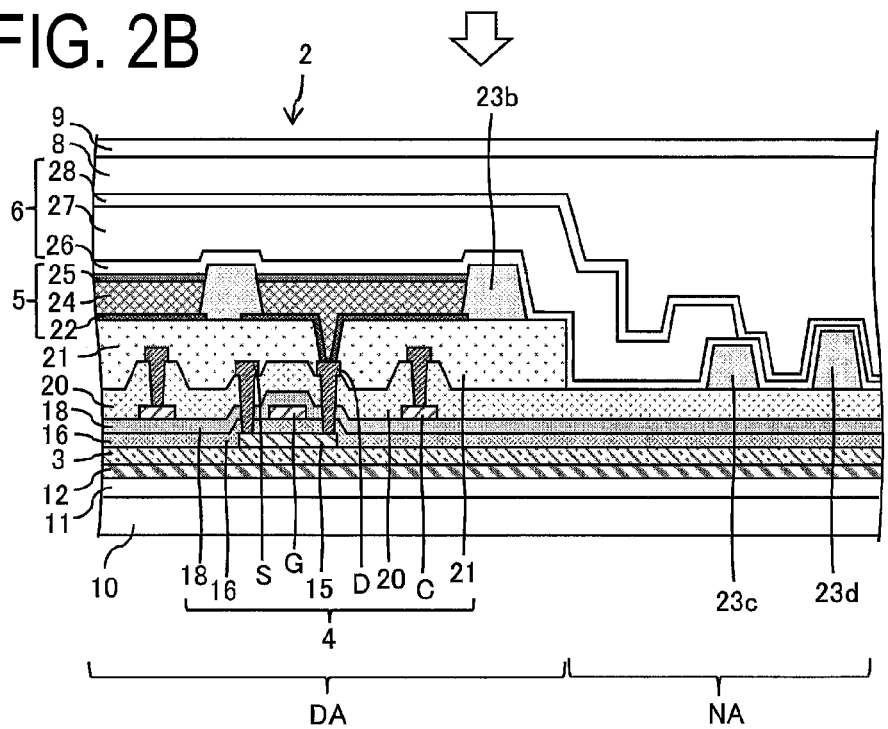

FIG. 1 is a flowchart illustrating an example of a production method of a display device. FIGS. 2A and 2B are cross-sectional views illustrating a configuration example (display region) of the display device of a present embodiment during formation.

When a flexible display device is produced, as illustrated in FIG. 1 and FIGS. 2A and 2B, first, a resin layer 12 is formed on a light-transmissive mother substrate (for example, a glass substrate) 50 (step S1). Next, a barrier layer 3 is formed (step S2). Next, a TFT layer 4 is formed that includes a plurality of inorganic insulating films 16, 18 and 20 (step S3). Next, a light emitting element layer (for example, an OLED element layer) 5 is formed (step S4). Next, a sealing layer 6 is formed that includes a first inorganic sealing film 26, a second inorganic sealing film 28, and an organic sealing film 27 (step S5). Next, a protection material 9 (a PET film, for example) is adhered to the sealing layer 6, with an adhesive layer 8 interposed therebetween (step S6).

Next, through the mother substrate 50, laser light is irradiated onto the lower face of the resin layer 12 (step S7). Here, by the resin layer 12 absorbing the laser light that has been irradiated onto the lower face of the mother substrate 50 and that has been transmitted through the mother substrate 50, the lower face of the resin layer 12 (an interface with the mother substrate 50) changes quality due to ablation, and a bonding strength between the resin layer 12 and the mother substrate 50 weakens. Next, the mother substrate 50 is peeled from the resin layer 12 (step S8). Next, as illustrated in FIG. 2B, a support material 10 (a lower face film such as a PET film, for example) is adhered to the lower face of the resin layer 12, with an adhesive layer 11 interposed therebetween (step S9). Next, a layered body including the support material 10, the resin layer 12, the barrier layer 3, the TFT layer 4, the light emitting element layer 5, the sealing layer 6, and the protection material 9 is cut so as to cut out a plurality of the display devices (step S10). Next, the protection material 9 on a terminal portion of the TFT layer 4 is peeled off, and terminal exposure is performed (step S11). In this way, a display device 2 illustrated in FIG. 2B is obtained. After that, a functional film is adhered (step S12), and an electronic circuit board is mounted on the terminal portion using an ACF or the like (step S13). Note that each of the above-described steps is performed by a display device production device.

Examples of a material of the resin layer 12 include a polyimide, an epoxy, and a polyamide. Examples of a material of the support material (lower face film) 10 include polyethylene terephthalate (PET).

The barrier layer 3 is a layer that inhibits moisture or impurities from reaching the TFT layer 4 or a light emitting element layer 5 when the display device 2 is being used, and can be constituted by a silicon oxide film, a silicon nitride film, or a silicon oxinitride film, or by a layered film of these, formed using CVD. The thickness of the barrier layer 3 is from 50 nm to 1500 nm, for example.

The TFT layer 4 includes a semiconductor film 15, the inorganic insulating film 16 (a gate insulating film) that is formed above the semiconductor film 15, a gate electrode G that is formed above the gate insulating film 16, the inorganic insulating film 18 that is formed above the gate electrode G, capacity wiring C that is formed above the inorganic insulating film 18, the inorganic insulating film 20 that is formed above the capacity wiring C, source wiring S and drain wiring D that are formed above the inorganic insulating film 20, and a flattening film 21 that is formed above the source wiring S and the drain wiring D.

A thin film transistor (TFT) includes the semiconductor film 15, the inorganic insulating film 16 (the gate insulating film), and the gate electrode G. In an end portion (a non-display region NA) of the TFT layer 4, terminals that are used for connection with an electronic circuit board, such as an IC chip and a FPC, and terminal wiring that is connected to the terminals are formed. The terminal wiring is electrically connected to various wiring of the TFT layer 4. The terminals and the terminal wiring are formed on the inorganic insulating film 18 or on the inorganic insulating film 20, for example.

The semiconductor film 15 is constituted by a low-temperature polysilicon (LTPS) or an oxide semiconductor, for example. The gate insulating film 16 can be formed by a silicon oxide (SiOx) film or a silicon nitride (SiNx) film, or a layered film of these, formed using CVD. The gate electrode G, the source wiring S, the drain wiring D, and the terminals are each constituted by a single-layer metal film or a layered metal film including at least one of aluminum (Al), tungsten (W), molybdenum (Mo), tantalum (Ta), chrome (Cr), titanium (Ti), and copper (Cu), for example. Note that, in FIGS. 2A and 2B, the TFT is illustrated that has a top gate configuration in which the semiconductor film 15 is the channel, but the TFT may have a bottom gate configuration (when the TFT channel is the oxide semiconductor, for example).

The inorganic insulating films 18 and 20 can be constituted by a silicon oxide (SiOx) film or a silicon nitride (SiNx) film, or a layered film of these, formed using CVD. The flattening film (interlayer insulating film) 21 can be constituted, for example, by a coatable photosensitive organic material, such as a polyimide, an acrylic, or the like.

The light emitting element layer 5 (an organic light emitting diode layer, for example) is constituted by an anode electrode 22 that is formed above the flattening film 21, a bank 23b that defines sub pixels of a display region DA (a region that overlaps with the light emitting element layer 5), an electroluminescence (EL) layer 24 that is formed above the anode electrode 22, and a cathode electrode 25 that is formed above the EL layer 24. A light emitting element (an organic light emitting diode, for example) is constituted by the anode electrode 22, the EL layer 24, and the cathode electrode 25.

A protrusion 23c and a protrusion 23d that define edges of the organic sealing film 27 are formed in the non-display region NA (the region that does not overlap with the light emitting element layer 5). The protrusion 23c is formed on the inorganic insulating film 20, for example, and functions as a liquid stopper when the organic sealing film 27 is applied using an ink-jet method. The protrusion 23d functions as a backup liquid stopper. The bank 23b, the protrusion 23c, and the protrusion 23d can be formed in the same process, for example, using a coatable photosensitive organic material such as a polyimide, an epoxy, an acrylic, or the like.

The EL layer 24 is formed in a region (a sub pixel region) surrounded by the bank 23b using vapor deposition or an ink-jet method. In the case that the light emitting element layer 5 is the organic light emitting diode (OLED) layer, the EL layer 24 is constituted by, for example, a hole injecting layer, a hole transport layer, a light emitting layer, an electron transport layer, and an electron injecting layer, layered in the above order from a lower layer side.

The anode electrode (positive electrode) 22 is formed by layering indium tin oxide (ITO) and an alloy containing Ag, for example, and has light reflectivity (to be described below in more detail). The cathode electrode 25 can be constituted by a light-transmissive conductive material such as indium tin oxide (ITO) and indium zinc oxide (IZO).

In the case that the light emitting element layer 5 is the OLED layer, positive holes and electrons are recombined inside the EL layer 24 by a drive current between the anode electrode 22 and the cathode electrode 25, and light is emitted as a result of excitons that are generated by the recombination falling into a ground state. Since the cathode electrode 25 is light-transmissive and the anode electrode 22 is light-reflective, the light emitted from the EL layer 24 travels upwards and results in top emission.

The light emitting element layer 5 need not necessarily be constituted by the OLED element, but may be constituted by an inorganic light emitting diode or a quantum dot light emitting diode.

The sealing layer 6 is light-transmissive, and includes the first inorganic sealing film 26 that covers the cathode electrode 25, the organic sealing film 27 that is formed above the first inorganic sealing film 26, and the second inorganic sealing film 28 that covers the organic sealing film 27.

The first inorganic sealing film 26 and the second inorganic sealing film 28 can be each constituted by a silicon oxide film, a silicon nitride film, or a silicon oxinitride film, or by a layered film of these, formed using CVD. The organic sealing film 27 is thicker than the first inorganic sealing film 26 and the second inorganic sealing film 28, is a light-transmissive organic film, and can be constituted by a coatable photosensitive organic material such as a polyimide, an acrylic, or the like. For example, after applying an ink containing such an organic material onto the first inorganic sealing film 26 using the ink-jet method, the ink is hardened by UV irradiation. The sealing layer 6 covers the light emitting element layer 5 and inhibits foreign matter, such as water and oxygen, from infiltrating to the light emitting element layer 5.

Note that the protection material 9 is adhered to the sealing layer 6, with the adhesive layer 8 interposed therebetween, and functions as a support material when the mother substrate 50 is peeled off. Examples of a material of the protection material 9 include polyethylene terephthalate (PET).

After the substrate 50 has been peeled off, the support material 10 is adhered to the lower face of the resin layer 12 so as to produce a display device having excellent flexibility. Examples of a material of the support material 10 include PET.

The functional film has an optical compensation function, a touch sensor function, a protective function, and the like, for example. The electronic circuit board is an IC chip or a flexible printed circuit board that is mounted on a plurality of terminals TM, for example.

Above, the explanation is given for a case of producing the flexible display device, but when a non-flexible display device is to be produced, since replacement of the substrate and the like is not required, the process may advance from step S6 to step S10 illustrated in FIG. 1, for example.

First Embodiment

Figure 3:
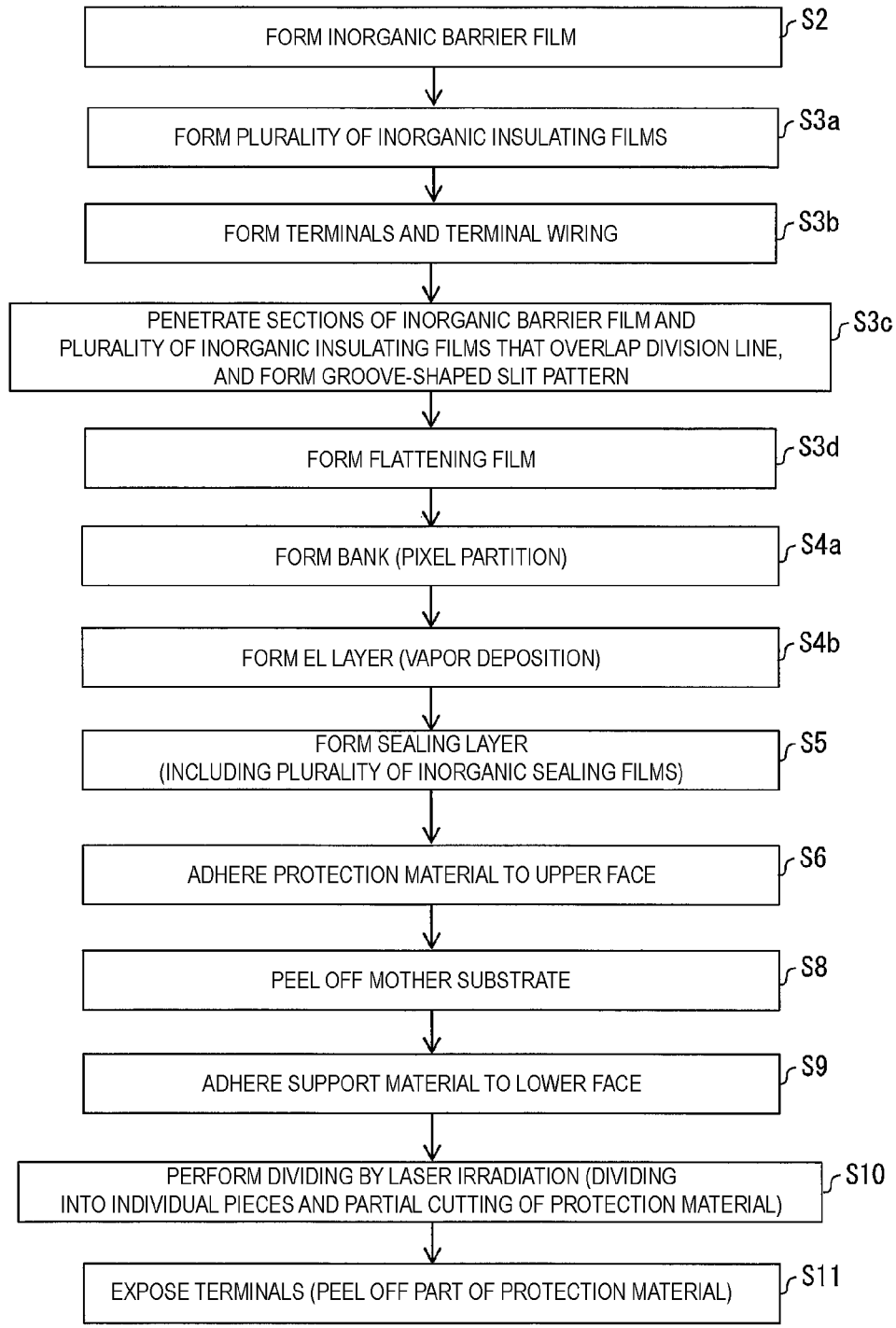
FIG. 3 is a flowchart illustrating a production method of the display device of a first embodiment.
Figure 4:
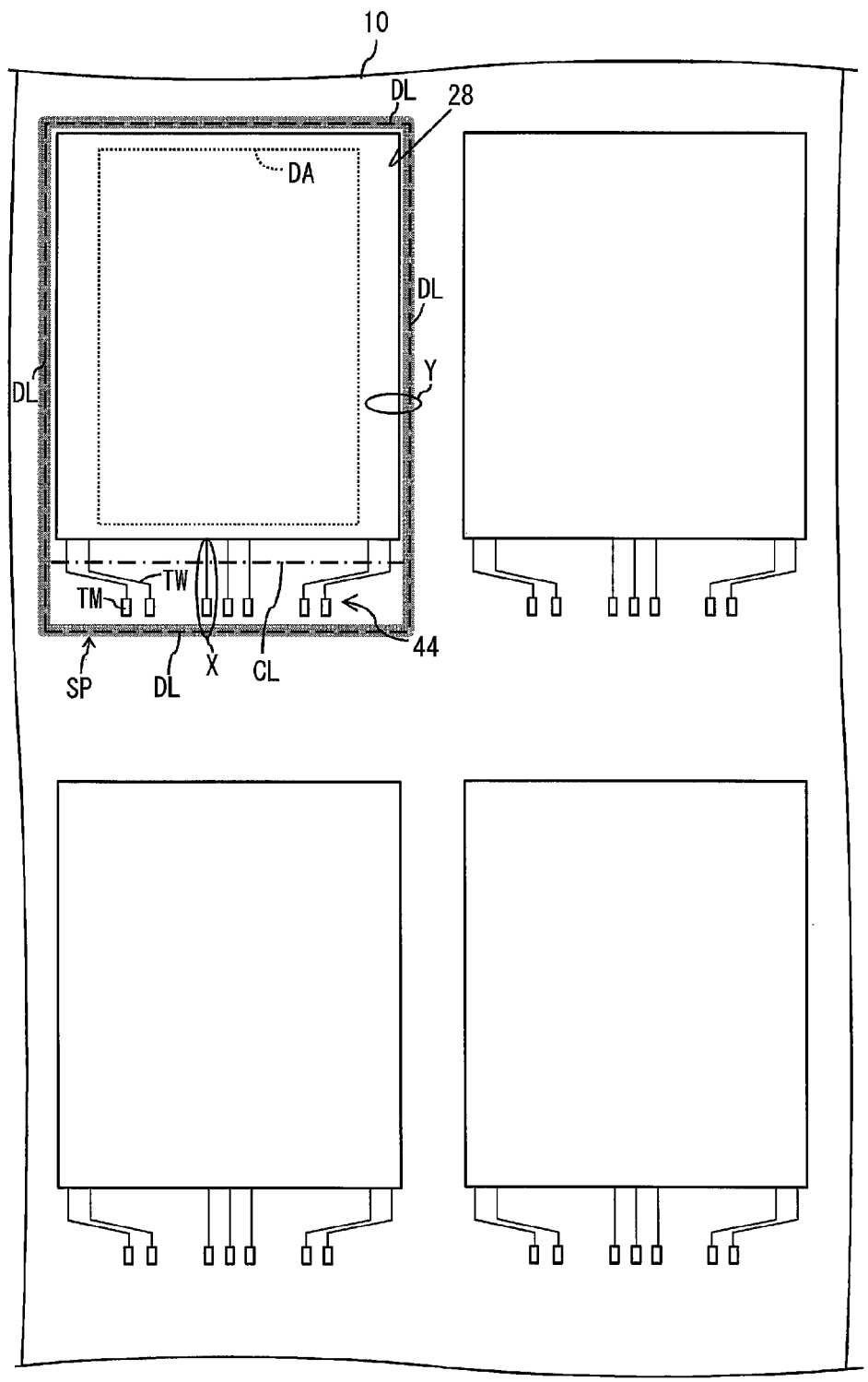
FIG. 4 is a plan view illustrating the production method (a division line, a cutting line, and the like) of the display device of the first embodiment.
Figure 5A:
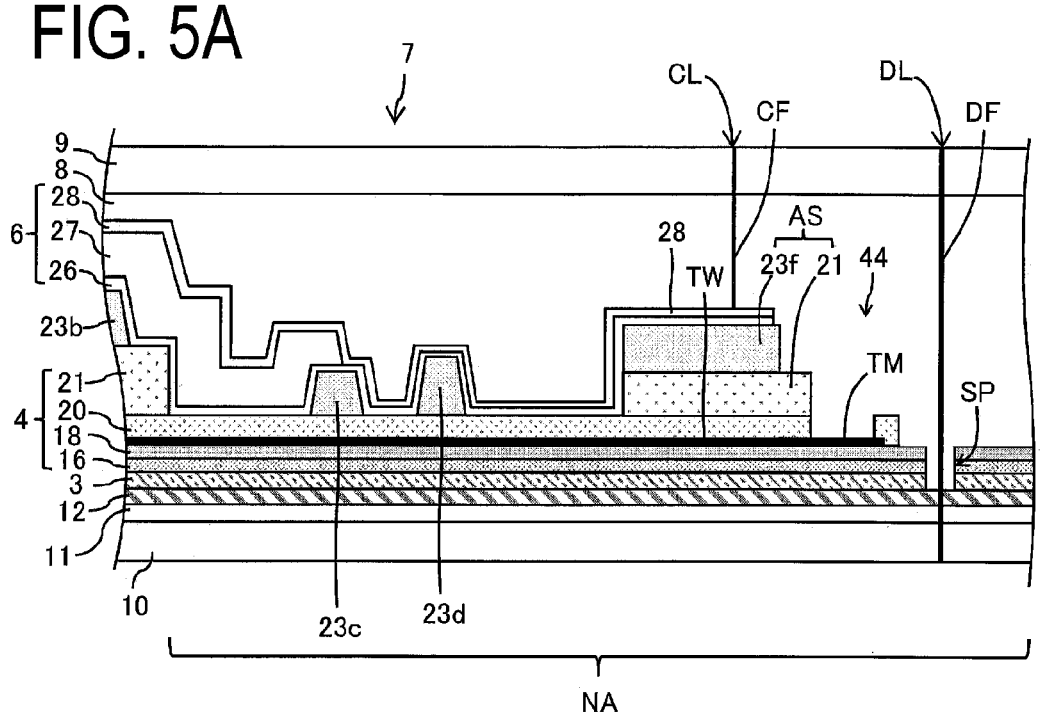
FIG. 5A is a cross-sectional view illustrating an X region of FIG. 4.
Figure 5B:
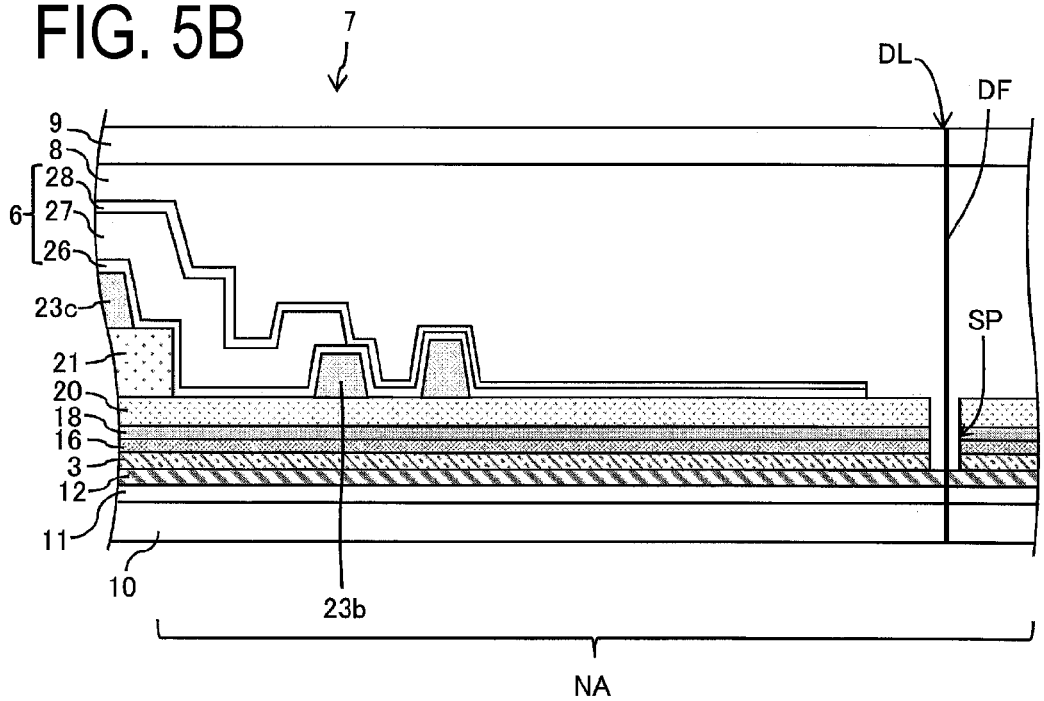
FIG. 5B is a cross-sectional view illustrating a Y region of FIG. 4.
Figure 6A:
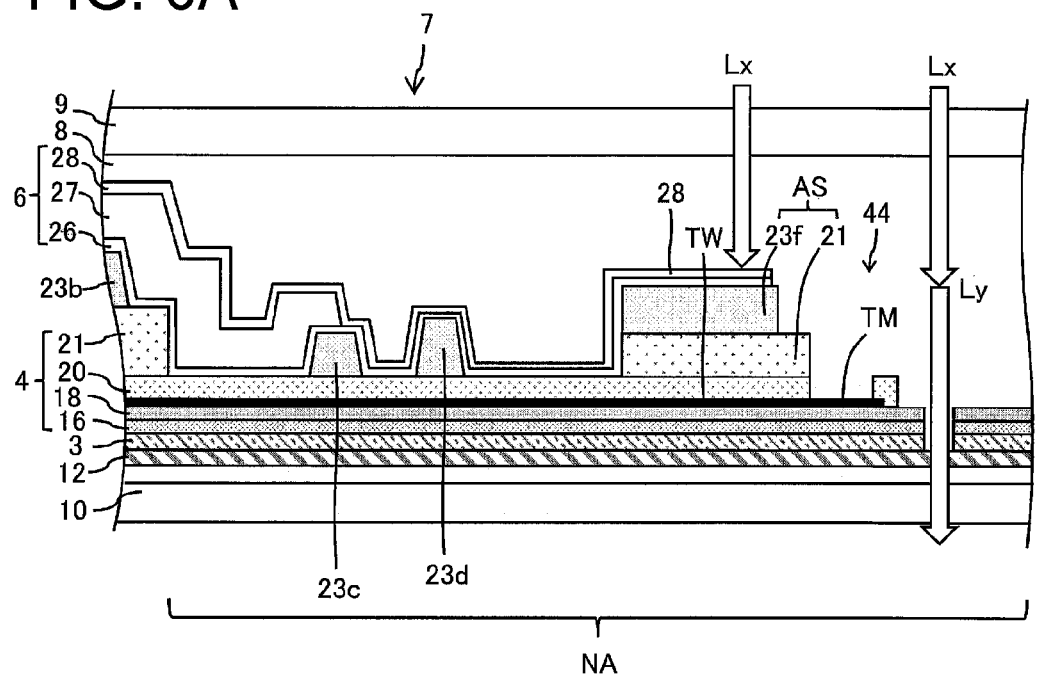
FIGS. 6A and 6B are cross-sectional views illustrating the production method (laser light irradiation positions) of the display device of the first embodiment.
Figure 6B:
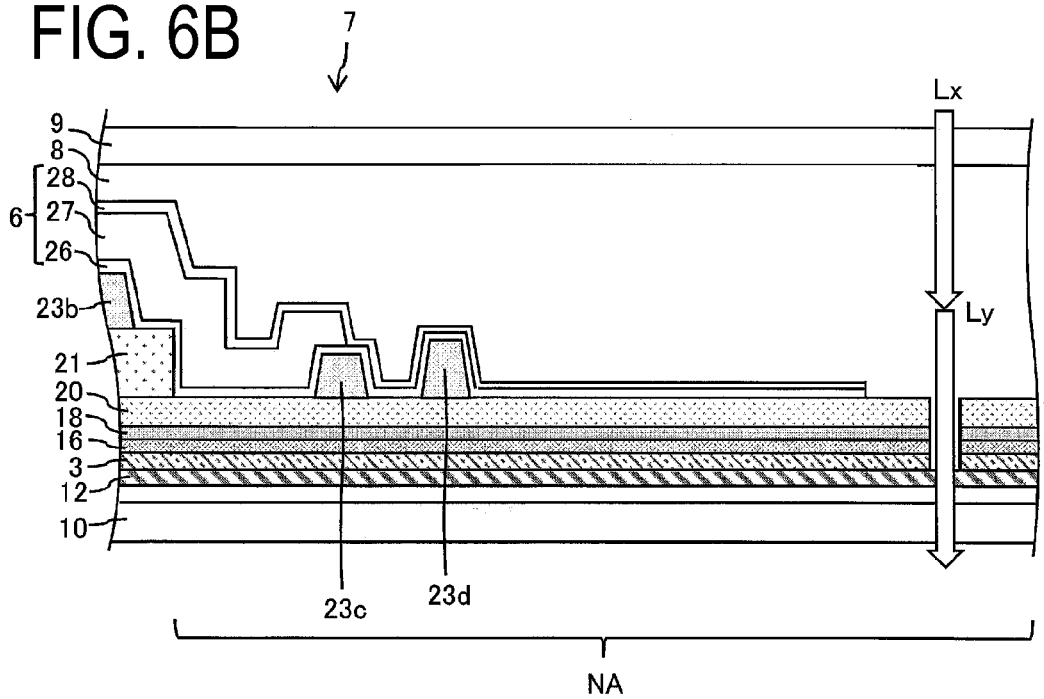
Figure 7A:
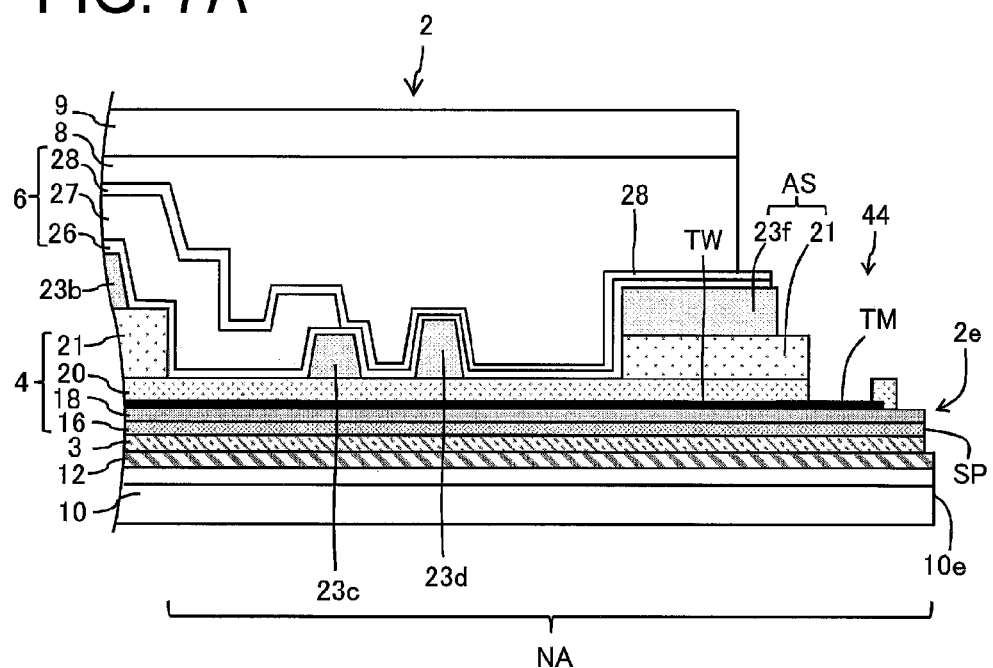
FIGS. 7A and 7B are cross-sectional views illustrating a configuration example of the display device of the first embodiment.
Figure 7B:
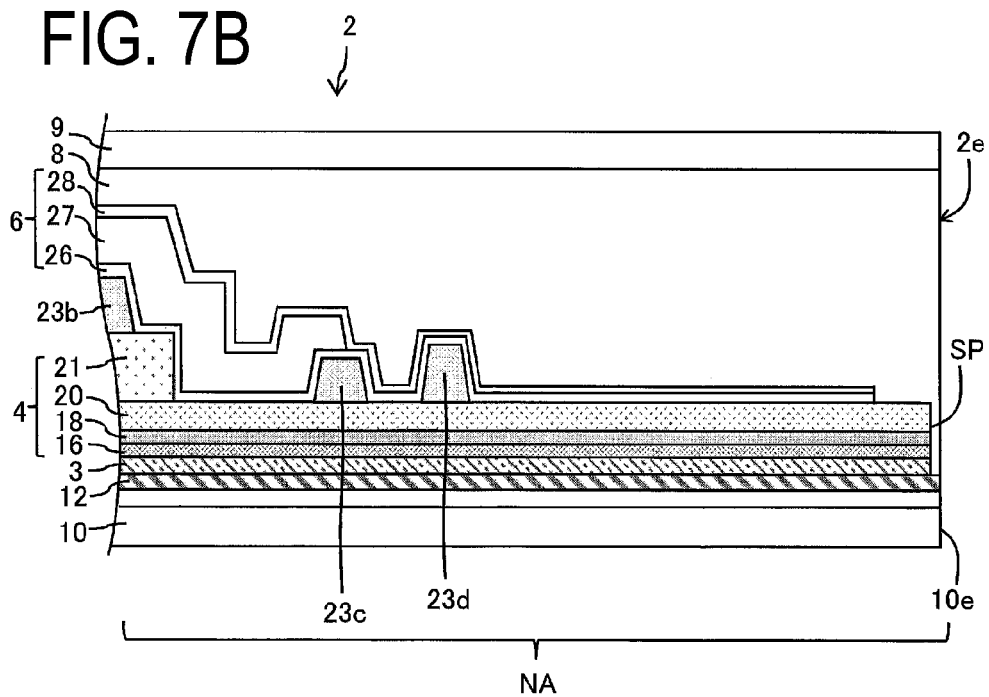

FIG. 3 is a flowchart illustrating a production method of the display device of a first embodiment. FIG. 4 is a plan view illustrating the production method (a division line, a cutting line, and the like) of the display device of the first embodiment. FIG. 5A is a cross-sectional view illustrating an X region of FIG. 4, and FIG. 5B is a cross-sectional view illustrating a Y region of FIG. 4. FIGS. 6A and 6B are cross-sectional views illustrating the production method (laser light irradiation positions) of the display device of the first embodiment. FIGS. 7A and 7B are cross-sectional views illustrating a configuration example of the display device of the first embodiment.

As illustrated in FIGS. 3 to 5B, in the first embodiment, first, the barrier layer 3 is formed (step S2). Next, the plurality of inorganic insulating films 16, 18, and 20 of the TFT layer 4 are formed (step S3a). Next, in a non-display region of the TFT layer 4, the terminals TM and terminal wiring TW (positioned further to the display region DA side than the terminals TM) that connect to the terminals TM are formed (step S3b). The terminals TM and the terminal wiring TW are formed in a layer between the inorganic insulating film 18 and the inorganic insulating film 20, and end faces of the terminals TM are covered by the inorganic insulating film 20.

Next, as illustrated in FIGS. 2A and 2B and 4 to 5B, sections of the barrier layer 3 and the inorganic insulating films 16, 18, and 20 that overlap with a division line DL are penetrated by photolithography, for example (step S3c). In this way, a groove-shaped slit pattern SP is formed that penetrates the inorganic insulating films 16, 18, and 20 and the barrier layer 3, so as to surround the display region DA. In a plan view, the slit pattern SP is formed on the division line DL.

Next, the flattening film 21 is formed that includes an underlayer of the light emitting element layer 5 (step S3d). In this process, a base portion of a laser light absorbing film AS of the non-display region NA is formed by the flattening film 21.

Next, the bank (pixel partition) 23b of the light emitting element layer 5 is formed (step S4a). In this process, an upper portion 23f of the laser light absorbing film AS of the non-display region NA is formed.

More specifically, an organic insulating film 23e, and the upper portion 23f of the laser light absorbing film AS are formed in the same layer and using the same material as the bank 23b.

Next, the EL layer 24 is formed by vapor deposition (step S4b). Next, the sealing layer 6 (the first inorganic sealing film 26, the second inorganic sealing film 28, and the organic sealing film 27) is formed (step S5). Here, the first inorganic sealing film 26 and the second inorganic sealing film 28 are pattern formed by performing CVD through a mask. More specifically, edges of the first inorganic sealing film 26 and the second inorganic sealing film 28 are formed outside the display region DA and inside the slit pattern SP.

Next, as illustrated in FIGS. 2A and 2B and FIGS. 4 to 5B, the protection material 9 is adhered onto the second inorganic sealing film 28, with the adhesive layer 8 interposed therebetween (step S6). Next, the mother substrate 50 is peeled off (step S8). Next, the support material 10 is adhered onto the lower face with the adhesive layer 11 interposed therebetween (step S9).

Next, as illustrated in FIGS. 6A and 6B, dividing by laser irradiation (partitioning into individual pieces and partial cutting of the protection material) is performed (step S10). A laser irradiation device (not illustrated) is used for dividing a layered body 7 (including the support material 10, the resin layer 12, the barrier layer 3, the TFT layer 4, the light emitting element layer 5, and the sealing layer 6, and the protection material 9) and cutting the protection material 9. Here, as illustrated in FIGS. 4 to 6B, before the dividing of the layered body 7, the protection material 9 is cut along a face CF that includes a cutting line CL. Here, the cutting line CL is a line for cutting the protection material 9 only (local cutting performed to expose the terminals), and the division line DL is a line for dividing the layered body 7.

In a plan view, the cutting line CL and the terminal wiring TW intersect with each other, and the laser light absorbing film AS, which is formed at step S3d and step S4a, covers a section of the terminal wiring TW that overlaps with the cutting line CL, with the inorganic insulating film 20 interposed therebetween. Note that the first inorganic sealing film 26 and the second inorganic sealing film 28, which are formed on the upper face of the laser light absorbing film AS, also overlap with the cutting line CL.

Note that the laser light absorbing film AS is not particularly limited, as long as it can absorb even a small amount of the laser light without allowing all the laser light to be transmitted through the film. For example, as the laser light absorbing film AS, a material obtained by mixing a colorant such as a paint or a pigment into a light-transmissive resin material can also be used (light absorbing properties of the resin material are improved by mixing in the pigment).

In FIGS. 6A and 6B, first, by performing irradiation of first laser light Lx on the cutting line CL and the division line DL, the protection material 9 and the adhesive layer 8 are cut, and at the same time, the layered body 7 is cut from the upper face thereof to partway through the layered body 7. Then, by performing irradiation of second laser light Ly on the division line DL, the layered body 7 is cut from partway therethrough to the lower face thereof (to the back surface of the support material 10), and the individual display devices are cut out. A carbon dioxide laser can be used for the first laser light Lx, for example, and a UV laser can be used for the second laser light Ly, for example.

Further, the terminals are exposed at step S11 in FIG. 3. Here, a portion of the cut protection material 9 (a section above a terminal portion 44) is hooked by a pin or the like, lifted, and peeled off. In this way, the display device 2 illustrated in FIGS. 7A and 7B can be obtained.

Figure 8:
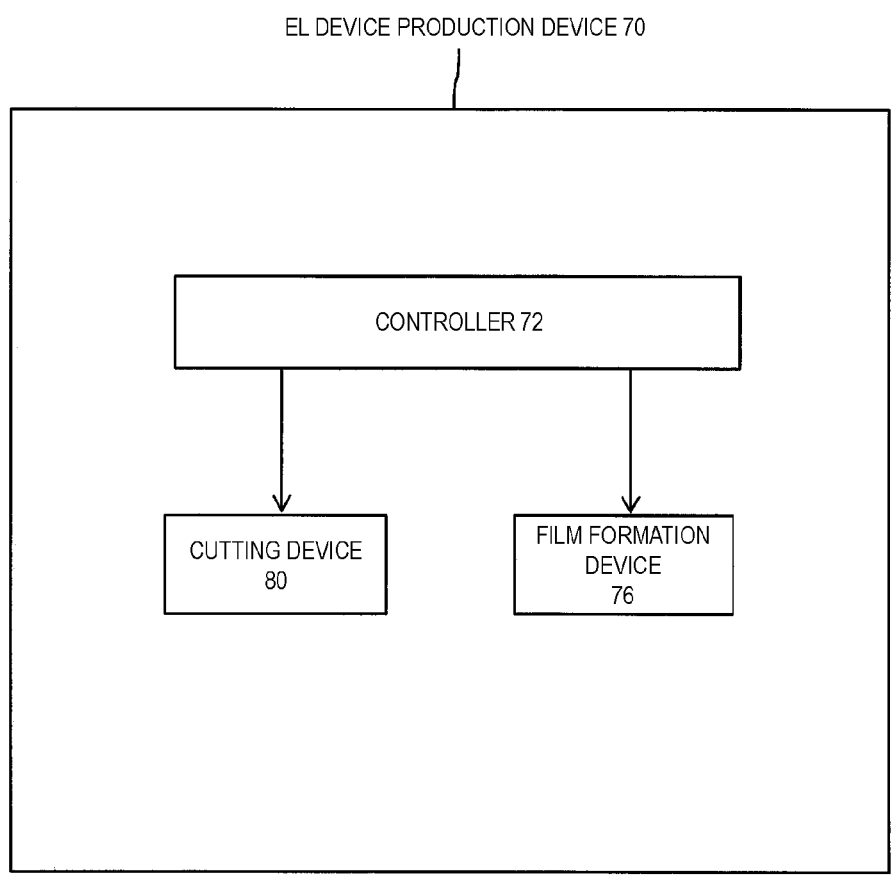
FIG. 8 is a block diagram illustrating a configuration of a display device production device of the first embodiment.

Note that, as illustrated in FIG. 8, a display device production device 70 includes a film formation device 76, a cutting device 80 that includes the laser irradiation device, and a controller 72 that controls these devices. The film formation device 76 that is controlled by the controller 72 performs the steps from step S3c to step S4a and step S5 in FIG. 3.

In the first embodiment, the dividing of the layered body 7 by the laser light becomes easy, since dividing faces (in other words, the laser light) pass through the slit pattern SP that is formed by the first inorganic sealing film 26, the second inorganic sealing film 28, the inorganic insulating films 16, 18, and 20, and the barrier layer 3 being penetrated (removed). Thus, a risk is reduced that cracks may occur in a hard inorganic film at the time of dividing, and that those cracks may negatively affect a function of the TFT layer 4 or the sealing layer 6 of each of the display devices after dicing.

In addition, since the terminal wiring TW is disposed below the cutting line CL with the laser light absorbing film AS interposed therebetween, even in a case where a strength of the first laser light Lx is too strong, for example, the energy thereof is absorbed by the laser light absorbing film AS. Thus, a risk of the terminal wiring TW being affected by the laser light (breakage of the wiring, for example) can be reduced. Therefore, in the display device 2 of FIGS. 7A and 7B, a laser ablation trace may be formed on the upper face of the laser light absorbing film AS.

Further, in the first embodiment, since the first inorganic sealing film 26 and the second inorganic sealing film 28, the laser light absorbing film AS, and the inorganic insulating film 20 are disposed between the cutting line CL and the terminal wiring TW, a situation can be avoided in which the terminal wiring TW is affected by the laser light.

In the display device 2 of FIGS. 7A and 7B, the slit pattern SP that penetrates the inorganic insulating films 16, 18, and 20 and the barrier layer 3 is formed, in a plan view, outside the display region DA and inside edges 10e of the support material 10. Further, in a plan view, the edges of the first inorganic sealing film 26 and the second inorganic sealing film 28 are formed outside the display region DA and inside the slit pattern SP.

Further, an end face 2e of the display device 2 passes through the slit pattern SP, and the slit pattern SP is buried by the organic insulating film 23e. The organic insulating film 23e is constituted by the same material as the bank 23b that covers the edges of the positive electrode 22 of the light emitting element layer 5. Note that the organic insulating film 23e may be constituted by a flattening film.

Figure 9A:
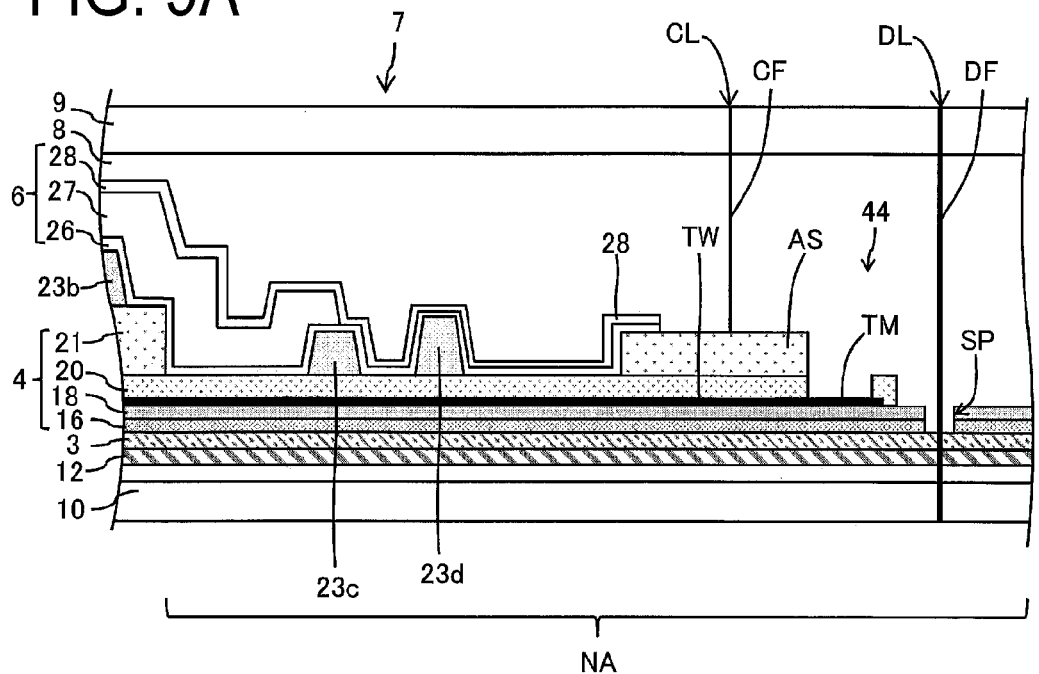
FIGS. 9A and 9B are cross-sectional views illustrating a modified example of the production method (the division line and the cutting line) of the display device according to the first embodiment.
Figure 9B:
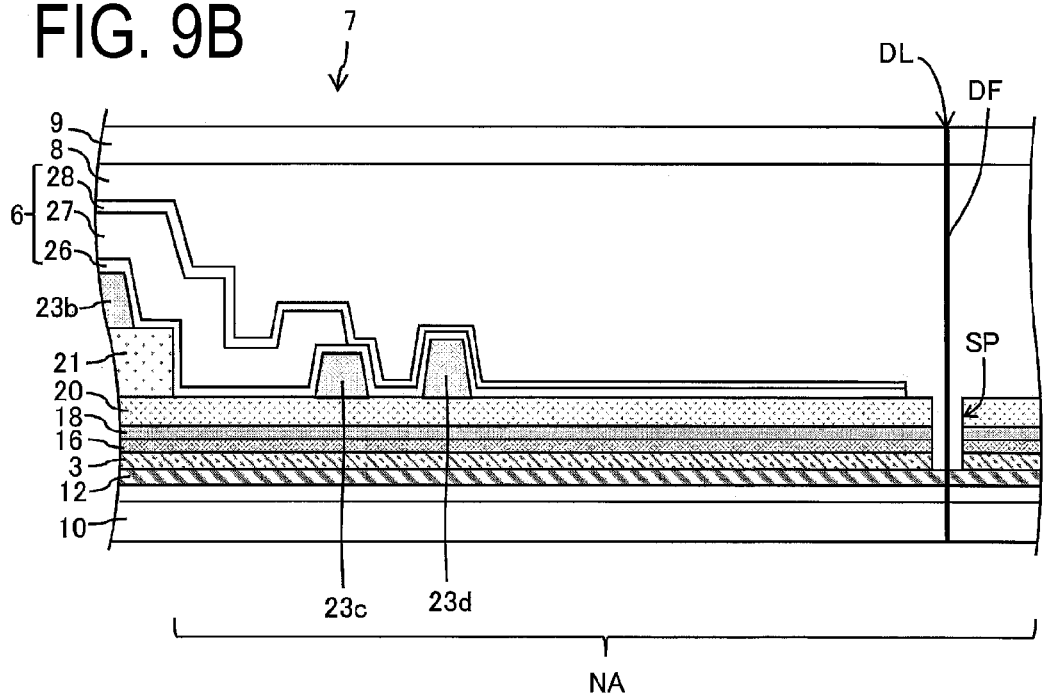

FIGS. 9A and 9B are cross-sectional views illustrating a modified example of the production method (the division line DL and the cutting line CL) of the display device of the first embodiment. As illustrated in FIGS. 9A and 9B, the sections of the inorganic insulating films 16, 18, and 20 that overlap with the division line DL are penetrated, but the barrier layer 3 need not necessarily be penetrated. In this case, the sections of the inorganic insulating films 16, 18, and 20 that overlap with the division line DL can be penetrated in the process of forming a contact hole (see FIGS. 2A and 2B) of the display region DA.

Further, as illustrated in FIG. 9A, a configuration may be adopted in which the laser light absorbing film AS is formed only by a flattening film, and the laser light absorbing film AS and the inorganic insulating film 20 (of the TFT layer 4) are disposed between the cutting line CL and the terminal wiring TW (the first inorganic sealing film 26 and the second inorganic sealing film 28 are not provided).

Second Embodiment

Figure 10:
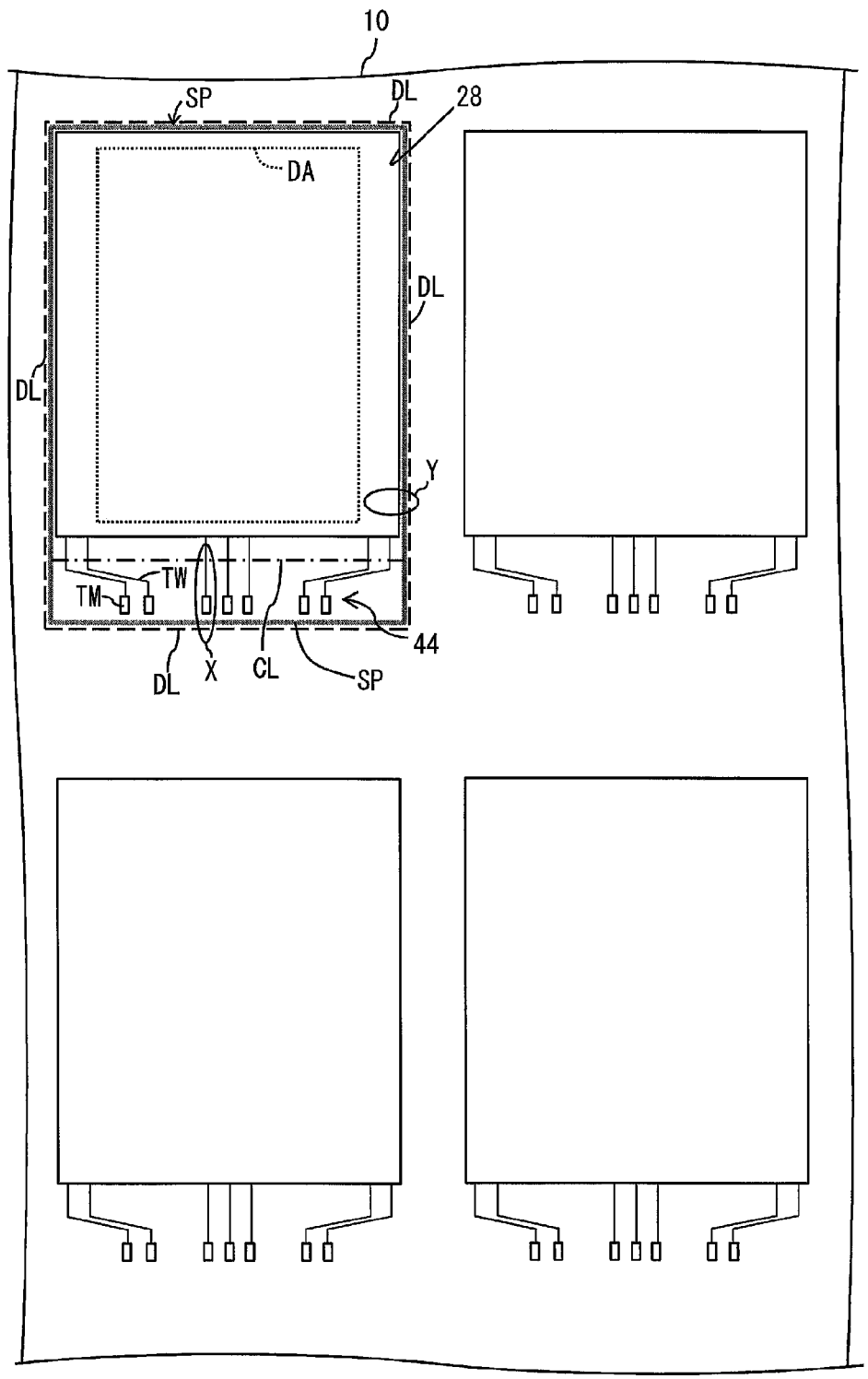
FIG. 10 is a plan view illustrating a production method (a division line, a cutting line, and the like) of a display device of a second embodiment.
Figure 12A:
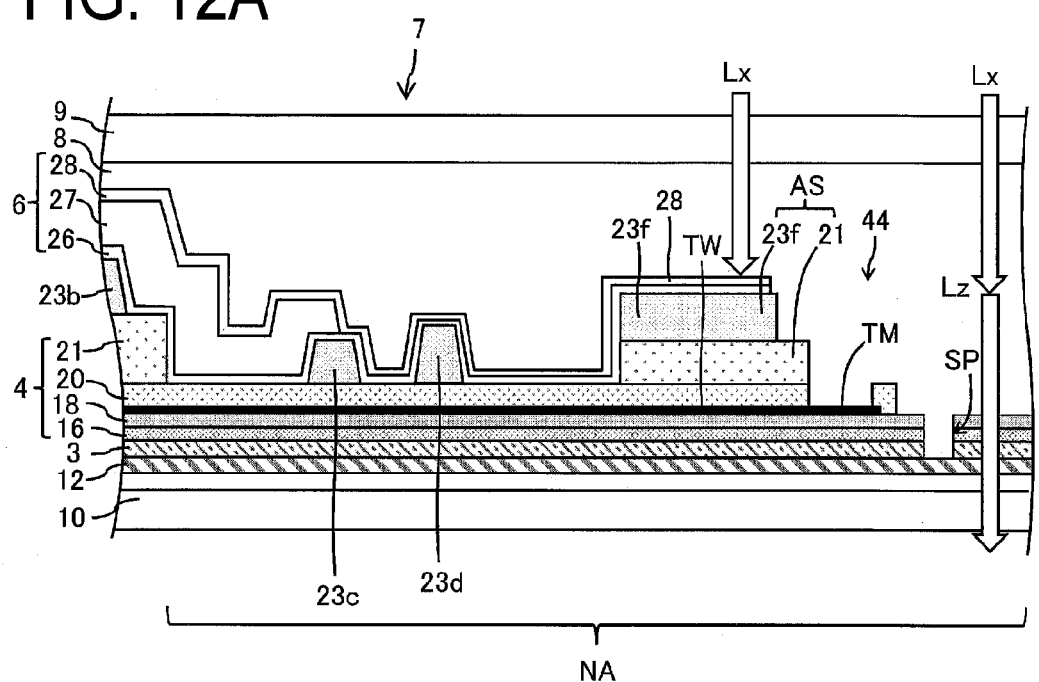
FIGS. 12A and 12B are cross-sectional views illustrating a production method (laser light irradiation positions) of the display device of the second embodiment.
Figure 12B:
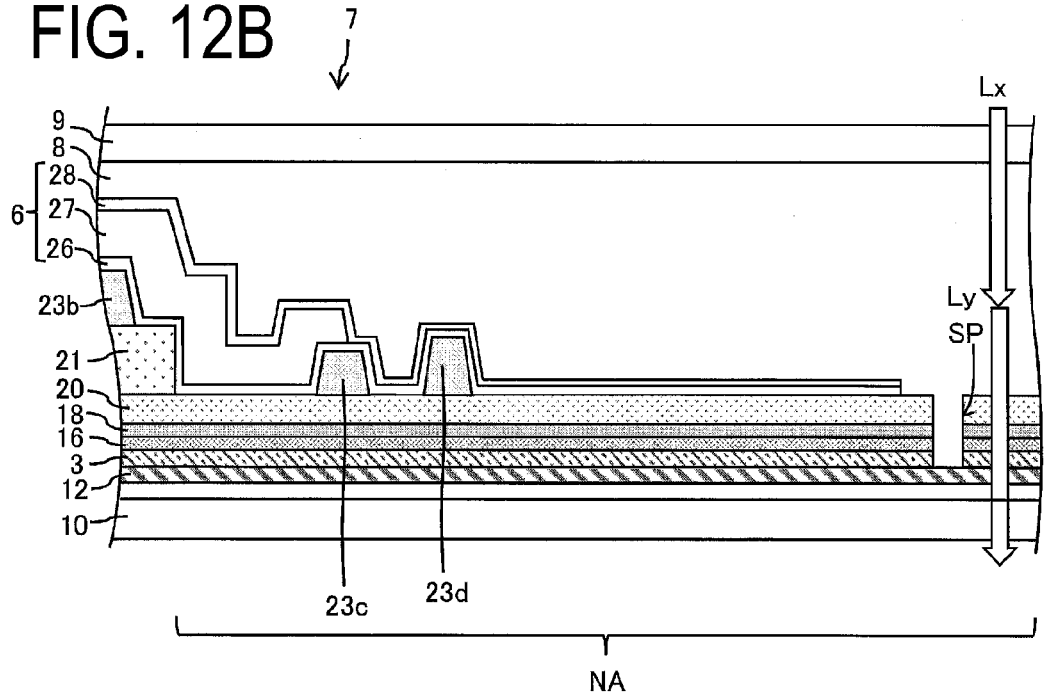
Figure 13A:
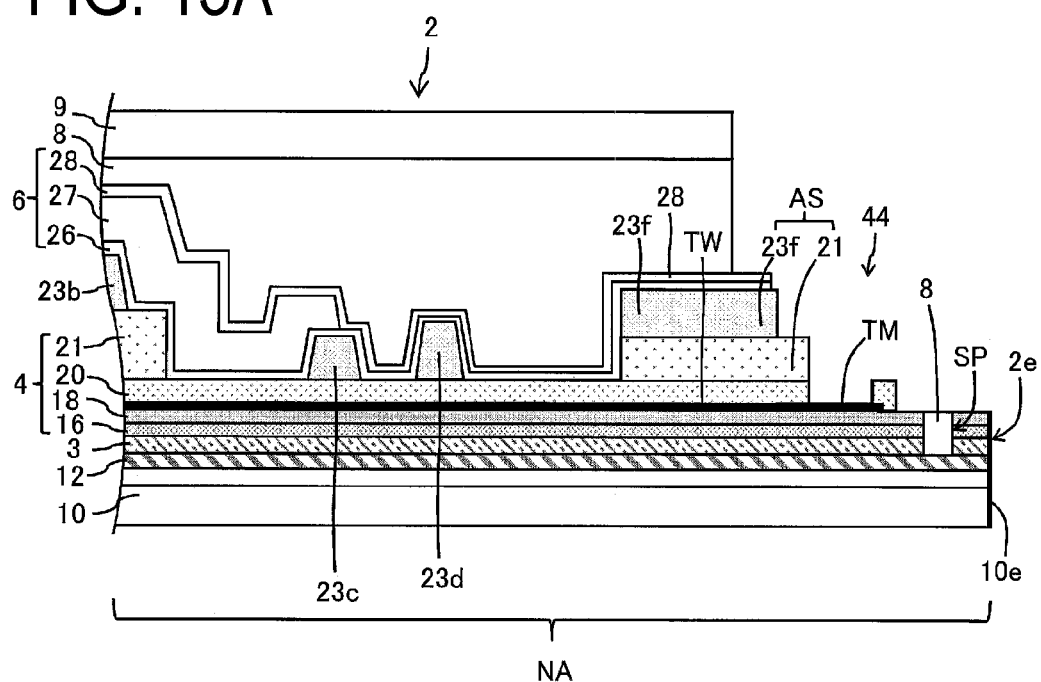
FIGS. 13A and 13B are cross-sectional views illustrating a configuration example of the display device of the second embodiment.
Figure 13B:
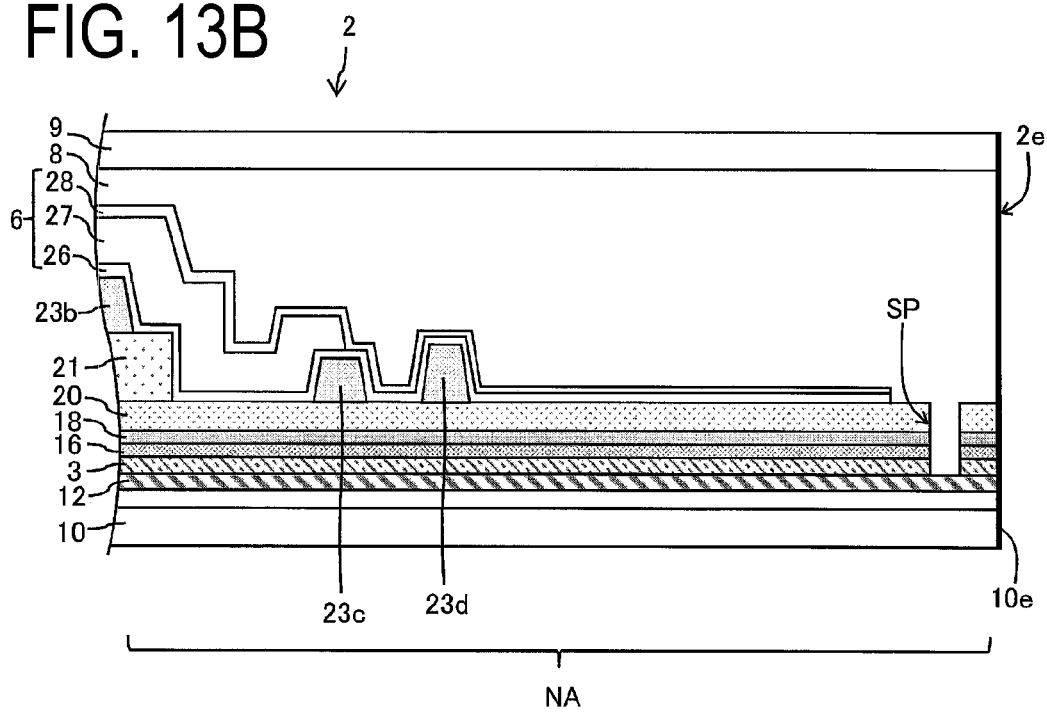

FIG. 10 is a plan view illustrating a production method (the division line DL, the cutting line CL, and the like) of the display device of a second embodiment. FIG. 11A is a cross-sectional view illustrating an X region of FIG. 10, and FIG. 11B is a cross-sectional view illustrating a Y region of FIG. 10. FIGS. 12A and 12B are cross-sectional views illustrating the production method (laser light irradiation positions) of the display device of the second embodiment. FIGS. 13A and 13B are cross-sectional views illustrating a configuration example of the display device of the second embodiment.

In the first embodiment, the slit pattern SP (a rectangular shape in a plan view), which is formed at step S3c in FIG. 3, is aligned with the division line DL (more specifically, the layered body 7 is partitioned along faces that pass through the slit pattern SP), but the configuration is not limited to this example.

As illustrated in FIG. 10 and FIGS. 11A and 11B, in a plan view, the division line DL may be set to be outside the slit pattern SP. The dividing of the layered body 7 and the cutting of the protection material 9 are performed in the same manner as in the first embodiment. However, greater energy is provided for a second laser light Lz in FIG. 12A than for the second laser light Ly in FIGS. 6A and 6B. In this way, the display device 2 illustrated in FIGS. 13A and 13B can be obtained.

In the display device 2 of FIGS. 13A and 13B, the slit pattern SP that penetrates the inorganic insulating films 16, 18, and 20 and the barrier layer 3 is formed, in a plan view, outside the display region DA and inside the edges 10e of the support material 10. Further, in a plan view, the edges of the first inorganic sealing film 26 and the second inorganic sealing film 28 are formed outside the display region DA and inside the slit pattern SP. The slit pattern SP is formed in a groove shape that surrounds the display region DA.

Further, the end face 2e of the display device 2 passes through the outer side of the slit pattern SP. More specifically, the inorganic insulating films 16, 18, and 20 and the barrier layer 3 that are penetrated by the slit pattern SP are present between the slit pattern SP and the end face 2e of the display device 2, and the slit pattern SP is buried by the organic insulating film 23e. The organic insulating film 23e is constituted by the same material as the bank 23b that covers the edges of the positive electrode 22 of the light emitting element layer 5. Note that the organic insulating film 23e may be configured by a flattening film. Note that a film composition on the terminal wiring TW is the same as that of the display device 2 (FIGS. 7A and 7B) of the first embodiment.

In the second embodiment, the slit pattern SP, which penetrates the first inorganic sealing film 26, the second inorganic sealing film 28, the inorganic insulating films 16, 18, and 20, and the barrier layer 3, is formed so as to extend along the inner side of the dividing face (on the display region side). Thus, even when cracks and the like occur in a hard inorganic insulating film or the like at the time of dividing the layered body 7, as illustrated in FIGS. 14A and 14B, since, even in a case where the cracks and the like occur, they are trapped by the slit pattern SP, the risk is reduced of those cracks and the like negatively affecting the function of the TFT layer 4 or the sealing layer 6 of the display device 2 after partitioning.

Figure 15A:
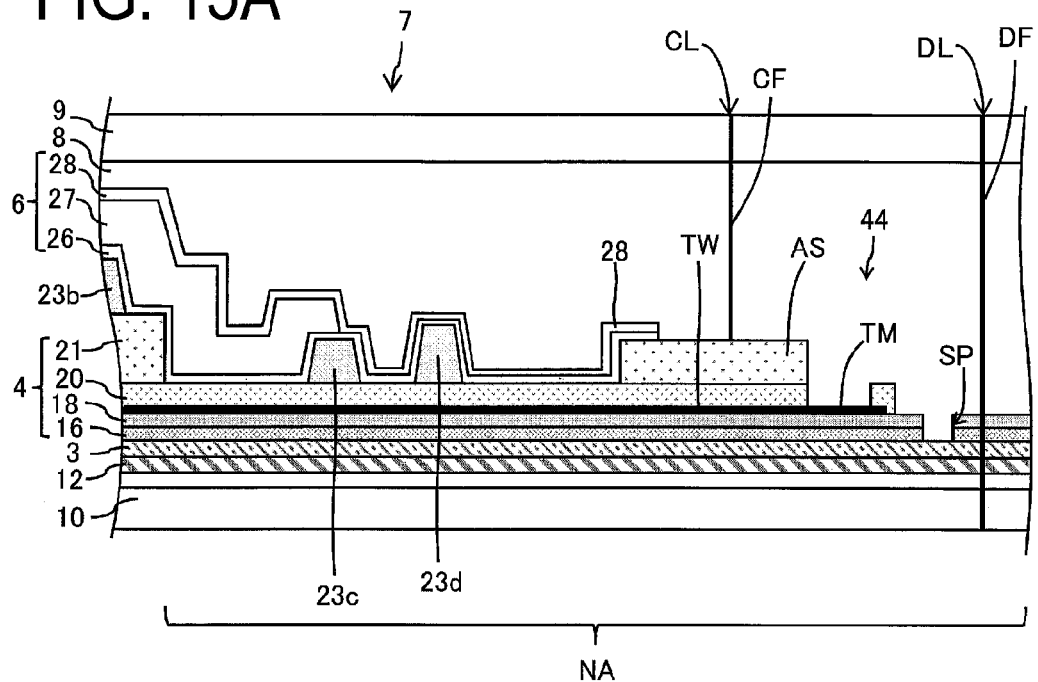
FIGS. 15A and 15B are cross-sectional views illustrating a modified example of the production method (the division line and the cutting line) of the display device of the second embodiment.
Figure 15B:
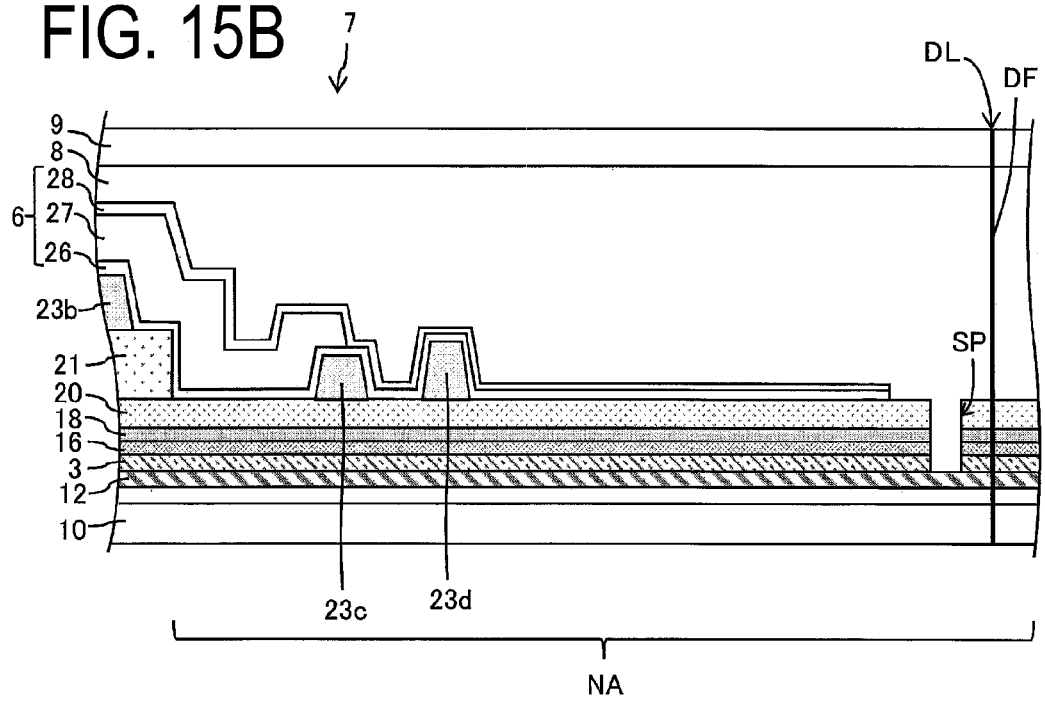

FIGS. 15A and 15B are cross-sectional views illustrating a modified example of the production method (the division line DL and the cutting line CL) of the display device of the second embodiment. As illustrated in FIGS. 15A and 15B, the sections of the inorganic insulating films 16, 18 and 20 that overlap with the division line DL are penetrated, but the barrier layer 3 need not necessarily be penetrated. In this case, the sections of the inorganic insulating films 16, 18, and 20 that overlap with the division line DL can be penetrated in the process of forming the contact hole (see FIGS. 2A and 2B) of the display region DA.

Further, as illustrated in FIG. 15A, a configuration may be adopted in which the laser light absorbing film AS is formed only by a flattening film, and the laser light absorbing film AS and the inorganic insulating film 20 (of the TFT layer 4) are disposed between the cutting line CL and the terminal wiring TW (the first inorganic sealing film 26 and the second inorganic sealing film 28 are not provided).

Figure 16A:
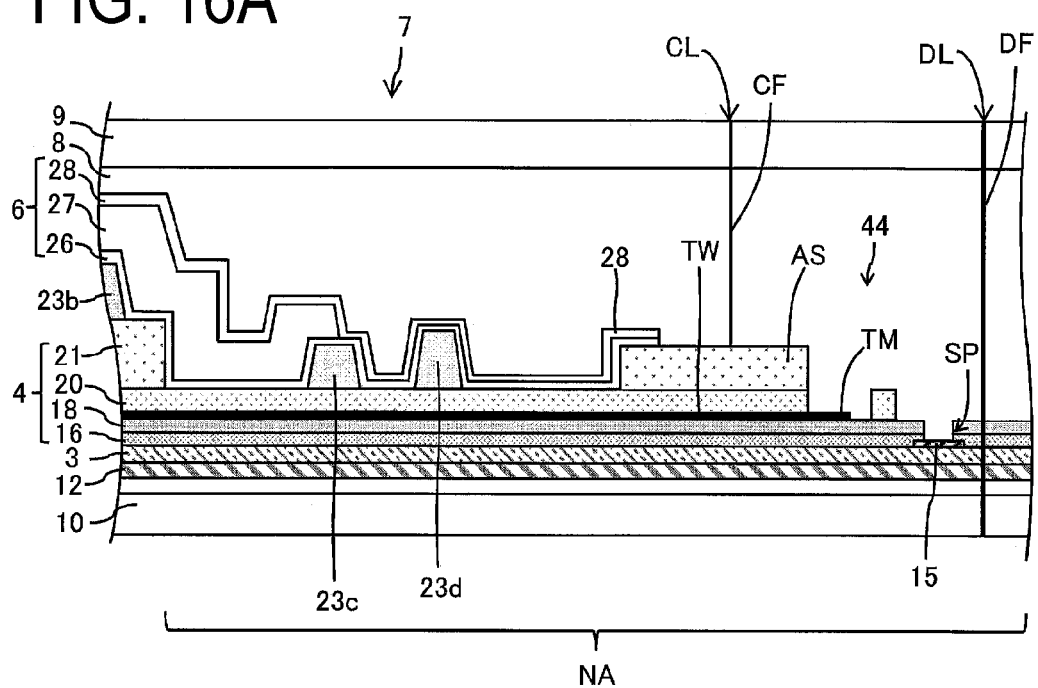
FIGS. 16A and 16B are cross-sectional views illustrating another modified example of the production method (the division line and the cutting line) of the display device of the second embodiment and the display device obtained by the production method.
Figure 16B:
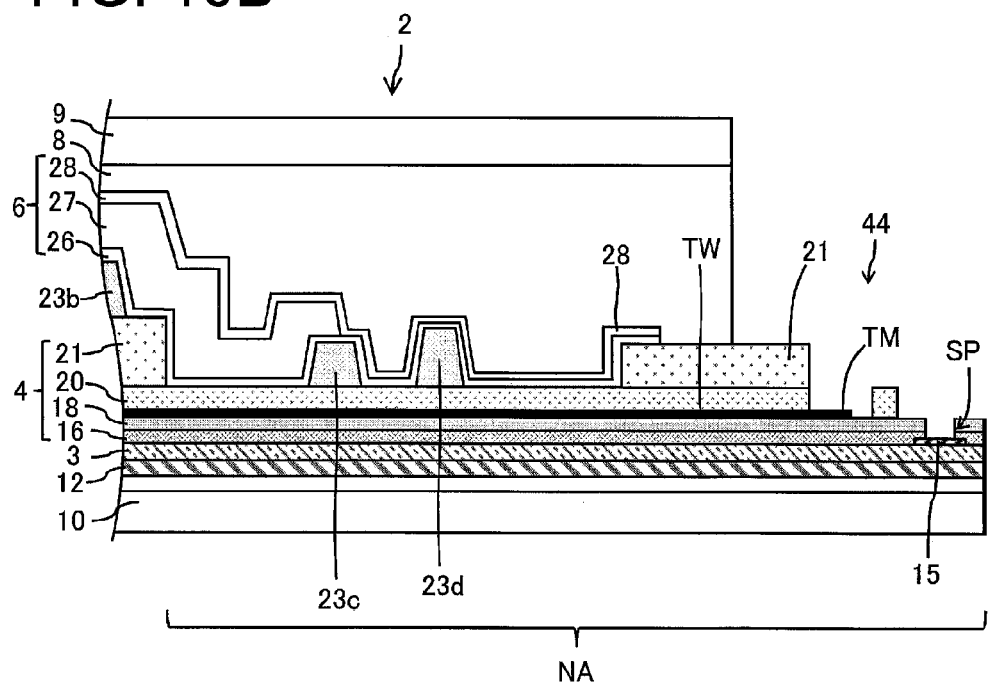

FIGS. 16A and 16B are cross-sectional views illustrating another modified example of the production method (the division line DL and the cutting line CL) of the display device of the second embodiment and a display device obtained by the production method. As illustrated in FIGS. 16A and 16B, the semiconductor film 15 that overlaps with the slit pattern SP may be formed in the non-display region NA of the TFT layer 4 and caused to function as an etching stopper. In this case, the semiconductor film 15 can be formed in the same process as the thin film transistor (TFT) of the display region DA.

Note that, when the TFT of the display region DA has the bottom gate configuration (when the oxide semiconductor is used as the channel of the TFT, for example), a conductive film that overlaps with the slit pattern SP can be formed (by the same process for the gate electrode, for example) and caused to function as an etching stopper.

Third Embodiment

Figure 17A:
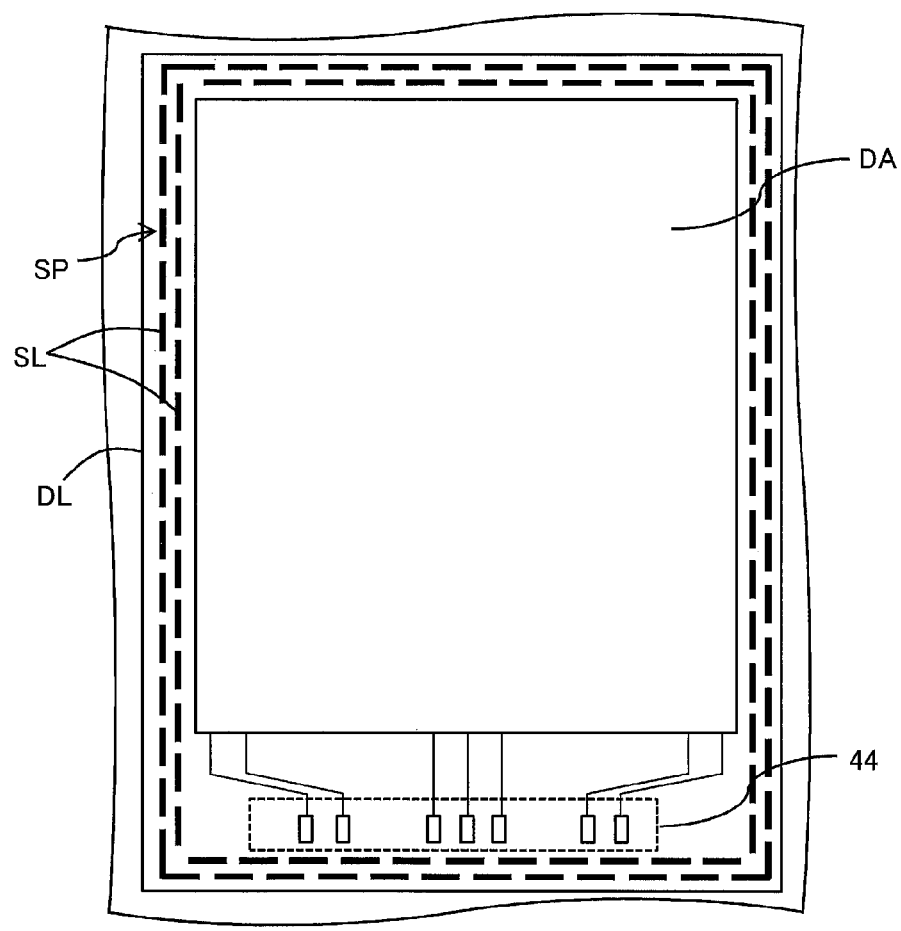
FIGS. 17A to 17C are plan views illustrating a configuration of a display device according to a third embodiment.
Figure 17B:
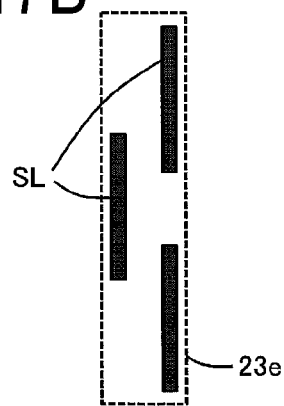
Figure 17C:
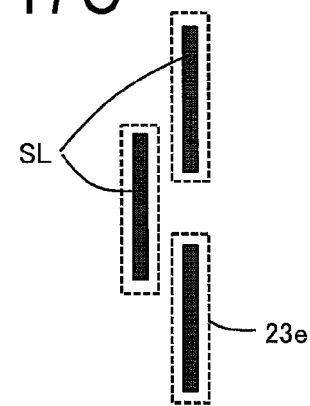

The slit pattern SP of the second embodiment (see FIG. 10, and the like) is configured by a single continuous groove-shaped slit, but the configuration is not limited to this example. FIGS. 17A to 17C are plan views illustrating a configuration of the display device according to a third embodiment. As illustrated in FIGS. 17A to 17C, the slit pattern SP can be configured by a plurality of island-shaped slits SL. In this case, it is preferable that the plurality of island-shaped slits SL be arranged in a staggered manner, and the plurality of island-shaped slits SL be present, in a plan view, between the division line DL and the display region DA and between the division line DL and the terminal portion 44.

Note that, as illustrated in FIG. 17B, the organic insulating film 23e may be provided so as to bury the plurality of island-shaped slits SL, or as illustrated in FIG. 17C, the organic insulating film 23e may be provided so as to individually bury each of the plurality of island-shaped slits.

Fourth Embodiment

Figure 18A:
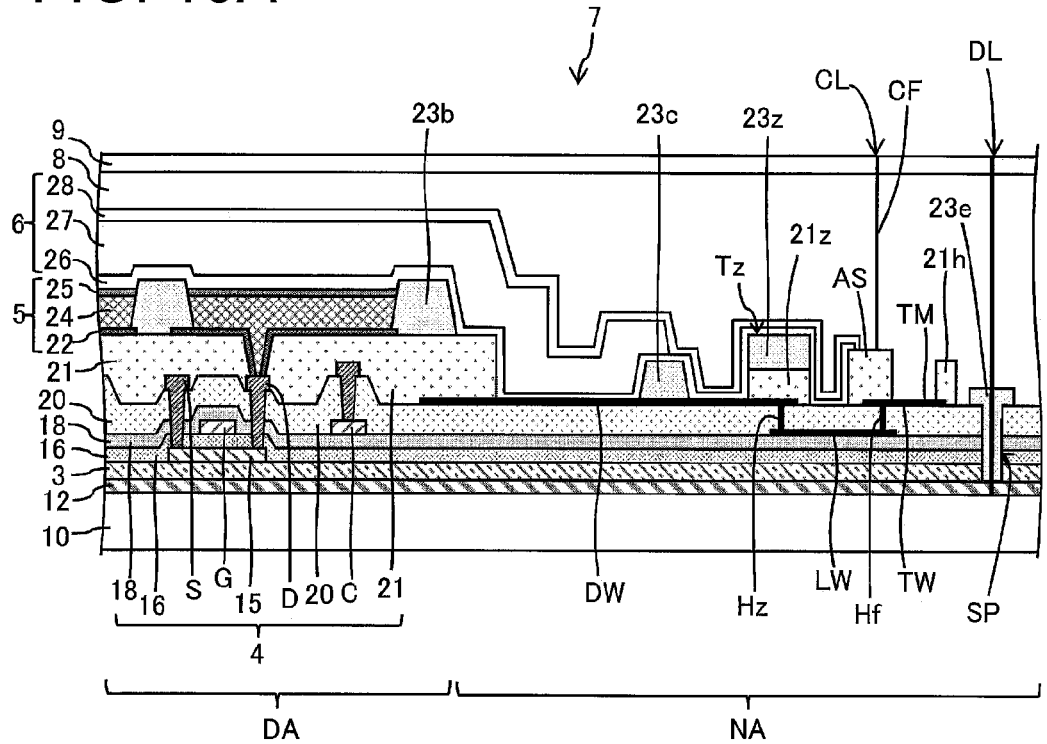
FIGS. 18A and 18B are cross-sectional views illustrating a production method of a display device according to a fourth embodiment and a configuration of the display device obtained by the production method.
Figure 18B:
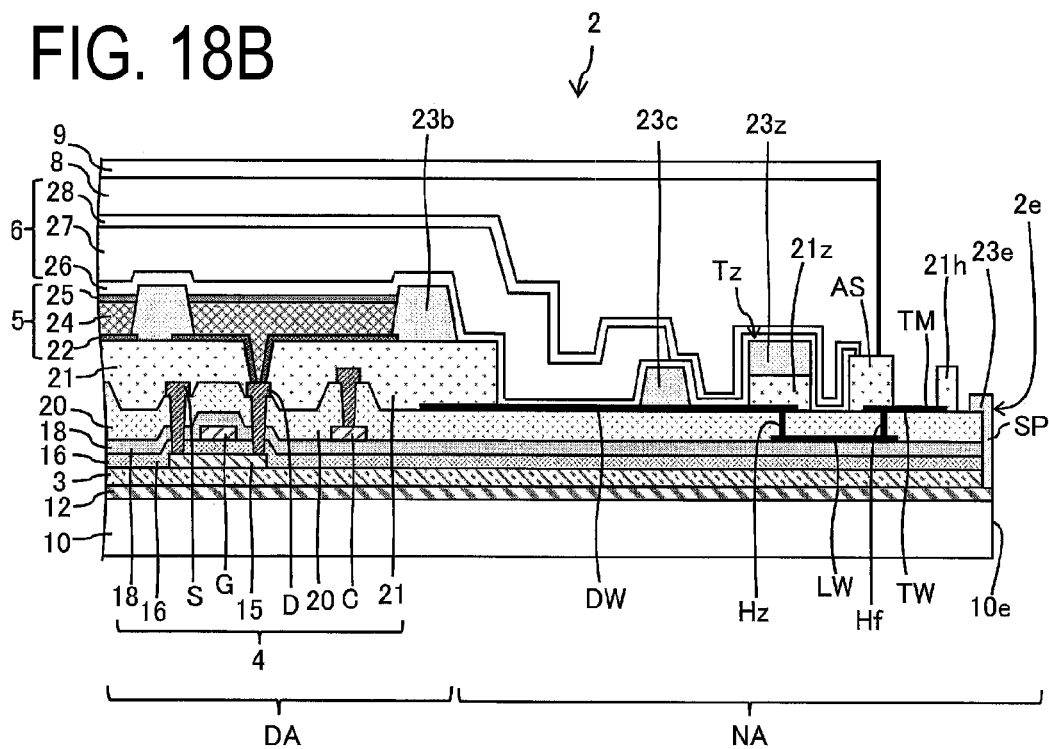
Figure 19A:
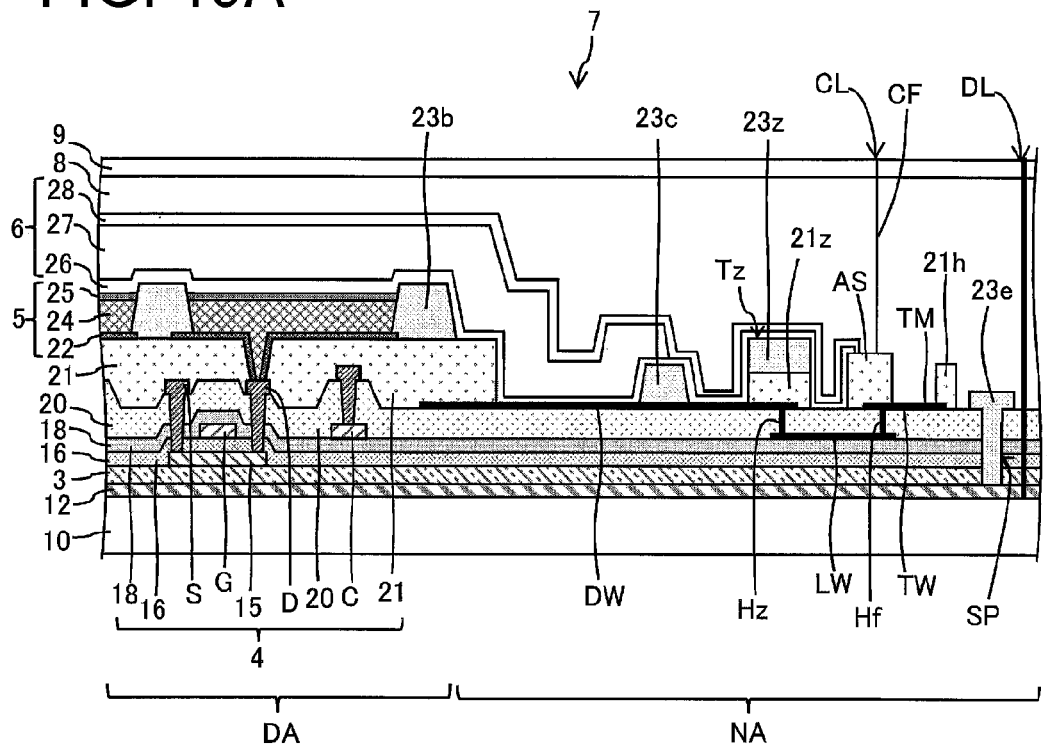
FIGS. 19A and 19B are cross-sectional views illustrating another production method of the display device according to the fourth embodiment and a configuration of the display device obtained by the production method.
Figure 19B:
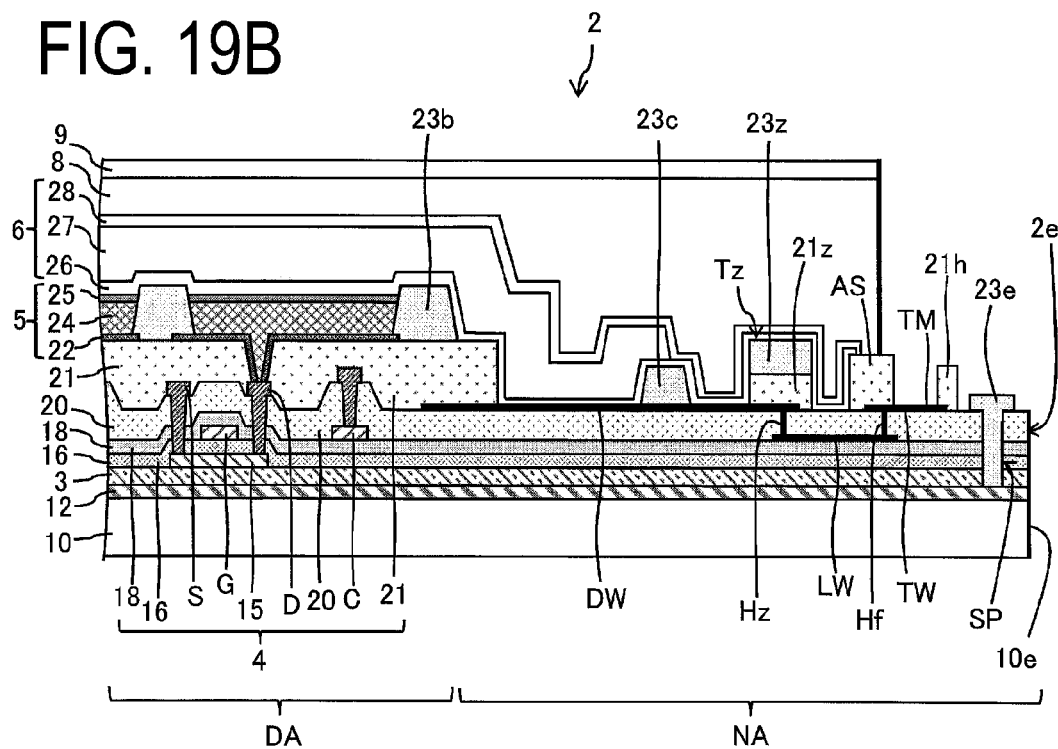

FIG. 18A is a cross-sectional view illustrating a production method of the display device according to a fourth embodiment, and FIG. 18B is a cross-sectional view illustrating a configuration of the display device obtained by the production method illustrated in FIG. 18A. FIG. 19A is a cross-sectional view illustrating another production method of the display device according to the fourth embodiment, and FIG. 19B is a cross-sectional view illustrating a configuration of the display device obtained by the production method illustrated in FIG. 19A.

In FIG. 18A, the groove-shaped slit pattern SP that penetrates the inorganic insulating films 16, 18, and 20, the barrier layer 3, and the resin layer 12 is formed so as to surround the display region DA. In a plan view, the slit pattern SP is formed on the division line DL, and the cutting line CL and the terminal wiring TW intersect with each other. The laser light absorbing film AS of the non-display region NA covers the section of the terminal wiring TW that overlaps with the cutting line CL.

In FIG. 18B, the slit pattern SP that penetrates through the inorganic insulating films 16, 18, and 20, the barrier layer 3, and the resin layer 12 is formed, in a plan view, outside the display region DA and inside the edges 10e of the support material 10. Further, in a plan view, the edges of the first inorganic sealing film 26 and the second inorganic sealing film 28 are formed outside the display region DA and inside the slit pattern SP.

Further, the end face 2e of the display device 2 passes through the slit pattern SP, and the slit pattern SP is buried by the organic insulating film 23e. The organic insulating film 23e is constituted by the same material as the bank 23b that covers the edges of the positive electrode 22 of the light emitting element layer 5. Note that the organic insulating film 23e may be configured by a flattening film.

As illustrated in FIG. 18B, the display device 2 includes the terminals TM and the terminal wiring TW, one end of which is connected to the terminals TM in the non-display region NA. Since the terminals TM and the terminal wiring TW are formed in the same process as the source wiring S and the like, the terminals TM and the terminal wiring TW are formed in the same layer (on the inorganic insulating film 20) using the same material as the source wiring S and the like.

The end faces of the terminals TM are covered by a film 21h, and the other end (on the opposite side to the one end connected to the terminals TM) of the terminal wiring TW is covered by the laser light absorbing film AS. Since the film 21h and the laser light absorbing film AS are formed in the same process as the flattening film 21, the film 21h and the laser light absorbing film AS are formed in the same layer and using the same material as the flattening film 21.

The terminal wiring TW is connected to relay wiring LW via a contact hole Hf that overlaps with the laser light absorbing film AS. The contact hole Hf penetrates the inorganic insulating film 20, and the relay wiring LW is formed in the same layer as the capacity wiring C (namely, on the inorganic insulating film 18). The relay wiring LW is connected to lead-out wiring DW, which extends from the display region DA of the TFT layer 4 via a contact hole Hz, which is formed to be closer to the display region DA than the contact hole Hf. The contact hole Hz penetrates the inorganic insulating film 20, and the lead-out wiring DW is formed in the same layer as the source wiring S and the drain wiring D (namely, on the inorganic insulating film 20).

A protrusion Tz that is constituted by an organic material is provided in the non-display region NA, and the protrusion Tz covers one end of the lead-out wiring DW. The contact hole Hz is formed so as to overlap with the protrusion Tz. Since a lower portion 21z of the protrusion Tz is formed in the same process as the flattening film 21, the lower portion 21z of the protrusion Tz is formed in the same layer and using the same material as the flattening film 21. Since an upper portion 23z of the protrusion Tz is formed in the same process as the bank 23b that covers the edges of the positive electrode 22 of the light emitting element layer 5, the upper portion 23z of the protrusion Tz is formed in the same layer and using the same material as the bank 23b.

When the terminals TM and the terminal wiring TW are formed in a multi-layer structure (a structure in which Al is sandwiched by two layers of Ti, for example), moisture more easily travels in an extending direction of the wiring. However, according to the configuration illustrated in FIGS. 18A and 18B, infiltration of the moisture can be inhibited by switching to the relay wiring LW of the lower layer. Further, by covering the other end (on the opposite side to the one end connected to the terminals TM) of the terminal wiring TW with the laser light absorbing film AS and by covering one end (on the non-display region side) of the lead-out wiring DW with the protrusion Tz, the infiltration of the moisture can be further inhibited.

In FIGS. 18A and 18B, the slit pattern SP is formed, in a plan view, on the division line DL, but the configuration is not limited to this example. As illustrated in FIG. 19A, the slit pattern SP may be formed, in a plan view, outside the display region DA and inside the division line DL. In the display device 2 of FIG. 19B, the slit pattern SP that penetrates through the inorganic insulating films 16, 18, and 20, the barrier layer 3, and the resin layer 12 is formed, in a plan view, outside the display region DA and inside the edges 10e of the support material 10.

Further, the end face 2e of the display device 2 passes through the outer side of the slit pattern SP. More specifically, the inorganic insulating films 16, 18, and 20, the barrier layer 3, and the resin layer 12 penetrated by the slit pattern SP are present between the slit pattern SP and the end face 2e of the display device 2, and the slit pattern SP is buried by the organic insulating film 23e.

In the display device 2 according to the above-described embodiments, the explanation is given for a case in which the support material 10 is a lower face film (a film of the lower side), for example, but the configuration is not limited to this example. The support material 10 may be a resin substrate such as a polyimide substrate and the like (in this case, the resin layer 12 may be omitted, or provided as necessary).

An electro-optical element (an electro-optical element whose luminance and transmittance are controlled by an electric current) that is provided in the display device 2 according to the present embodiment is not particularly limited. Examples of the display device 2 according to the present embodiment include an organic electroluminescence (EL) display provided with the organic light emitting diode (OLED) as the electro-optical element, an inorganic EL display provided with an inorganic light emitting diode as the electro-optical element, and a quantum dot light emitting diode (QLED) display provided with a QLED as the electro-optical element.

Supplement

First aspect: A display device includes a TFT layer including a plurality of inorganic insulating films, a light emitting element layer, and a sealing layer disposed above a support material, wherein a slit pattern that penetrates at least one of the plurality of inorganic insulating films is formed outside a display region and inside edges of the support material in a plan view.

Second aspect: In the display device according to the first aspect, for example, the slit pattern penetrates all of the plurality of inorganic insulating films.

Third aspect: In the display device according to the first or second aspect, for example, a barrier layer is included below the TFT layer, and the slit pattern penetrates the barrier layer.

Fourth aspect: In the display device according to any one of the first to third aspects, for example, an inorganic sealing film is included in the sealing layer, and, in a plan view, edges of the inorganic sealing film are formed outside the display region and inside the slit pattern.

Fifth aspect: In the display device according to any one of the first to fourth aspects, for example, an end face of the display device passes through the slit pattern.

Sixth aspect: In the display device according to any one of the first to fourth aspects, for example, the at least one of the inorganic insulating films that is penetrated by the slit pattern is present between the slit pattern and an end face of the display device.

Seventh aspect: In the display device according to the third aspect, for example, a resin layer is included below the barrier layer, and the slit pattern reaches as far as an upper face of the resin layer and does not penetrate the resin layer.

Eighth aspect: In the display device according to the sixth aspect, for example, one of a semiconductor film and a conductive film is provided overlapping with the slit pattern.

Ninth aspect: In the display device according to any one of the first to eighth aspects, for example, the slit pattern is buried by an organic insulating film.

Tenth aspect: In the display device according to the ninth aspect, for example, at least a portion of the organic insulating film is constituted by an identical material to a bank that covers edges of a lower electrode of the light emitting element layer.

Eleventh aspect: In the display device according to the ninth aspect, for example, at least a portion of the organic insulating film is constituted by an identical material to a flattening film that includes an underlayer of the light emitting element layer.

Twelfth aspect: In the display device according to any one of the first to eleventh aspects, for example, the support material is one of a lower face film and a resin substrate.

Thirteenth aspect: In the display device according to any one of the first to twelfth aspects, for example, the slit pattern includes one of at least one groove-shaped slit and a plurality of island-shaped slits.

Fourteenth aspect: In the display device according to the thirteenth aspect, for example, the plurality of island-shaped slits are buried by the organic insulating film.

Fifteenth aspect: In the display device according to the fourteenth aspect, for example, one of the plurality of island-shaped slits and another one of the plurality of island-shaped slits are buried by separate island-shaped organic insulating films.

Sixteenth aspect: A display device includes: a TFT layer; a light emitting element layer; a sealing layer; and a terminal, terminal wiring connected to the terminal, and a laser light absorbing film covering at least a portion of the terminal wiring provided in a non-display region.

Seventeenth aspect: In the display device according to the sixteenth aspect, for example, at least a portion of the laser light absorbing film is formed by an identical material to a flattening film that includes an underlayer of the light emitting element layer.

Eighteenth aspect: In the display device according to the sixteenth or seventeenth aspect, for example, at least a portion of the laser light absorbing film is formed by an identical material to a bank that covers edges of a lower electrode of the light emitting element layer.

Nineteenth aspect: In the display device according to any one of the sixteenth to eighteenth aspects, for example, the laser light absorbing film overlaps with an inorganic insulating film that is included in the TFT layer and is disposed above the terminal wiring.

Twentieth aspect: In the display device according to any one of the sixteenth to nineteenth aspects, for example, the laser light absorbing film overlaps with an inorganic sealing film included in the sealing layer.

Twenty-first aspect: In the display device according to any one of the sixteenth to twentieth aspects, for example, a laser ablation trace is formed on an upper face of the laser light absorbing film.

Twenty-second aspect: A production method of a display device includes: forming a TFT layer including a plurality of inorganic insulating films, a light emitting element layer, and a sealing layer above a mother substrate; adhering a protection material above the sealing layer; separating a layered body obtained by the steps from the mother substrate; adhering a support material to a lower face of the layered body; and dividing the layered body along a face including a division line, wherein a slit pattern that penetrates at least one of the plurality of inorganic insulating films is formed on the division line in a plan view, or outside a display region and inside the division line in a plan view.

Twenty-third aspect: In the production method of the display device according to the twenty-second aspect, for example, the slit pattern penetrates all of the plurality of inorganic insulating films.

Twenty-fourth aspect: In the production method of the display device according to the twenty-second or twenty-third aspect, for example, a barrier layer is formed below the TFT layer, and the slit pattern penetrates the barrier layer.

Twenty-fifth aspect: In the production method of the display device according to the twenty-second or twenty-third aspect, for example, the slit pattern is simultaneously formed with a contact hole of the TFT layer.

Twenty-sixth aspect, In the production method of the display device according to any one of the twenty-second to twenty-fifth aspects, for example, an inorganic sealing film is included in the sealing layer, and, in a plan view, edges of the inorganic sealing film are formed outside the display region and inside the slit pattern.

Twenty-seventh aspect: In the production method of the display device according to the twenty-sixth aspect, for example, the inorganic sealing film is formed by CVD using a mask.

Twenty-eighth aspect: In the production method of the display device according to the twenty-second aspect, for example, before the dividing of the layered body, the protection material is cut along a face that includes a cutting line which is positioned, in a plan view, between a terminal portion and the display region.

Twenty-ninth aspect: In the production method of the display device according to the twenty-eighth aspect, for example, in a plan view, the cutting line and terminal wiring of the TFT layer intersect with each other.

Thirtieth aspect: In the production method of the display device according to the twenty-ninth aspect, for example, a laser light absorbing film that overlaps with the cutting line is formed above the terminal wiring.

Thirty-first aspect: In the production method of the display device according to the thirtieth aspect, for example, at least a portion of the laser light absorbing film is simultaneously formed with a flattening film that includes an underlayer of the light emitting element layer.

Thirty-second aspect: In the production method of the display device according to the thirtieth aspect, for example, at least a portion of the laser light absorbing film is simultaneously formed with a bank that covers edges of a lower electrode of the light emitting element layer.

Thirty-third aspect: In the production method of the display device according to any one of the twenty-eighth to thirty-second aspects, for example, the protection material is cut by irradiating a first laser light on the cutting line.

Thirty-fourth aspect: In the production method of the display device according to the thirty-third aspect, for example, the layered body is cut from an upper face thereof to partway therethrough, by irradiating the first laser light on the division line.

Thirty-fifth aspect: In the production method of the display device according to the thirty-fifth aspect, the layered body is cut from the partway therethrough to a lower face thereof, by irradiating a second laser light on the division line.

Thirty-sixth aspect: A production device of a display device is configured to: form a TFT layer including a plurality of inorganic insulating films, a light emitting element layer, and a sealing layer above a mother substrate; adhere a protection material above the sealing layer; separate a layered body obtained by the processes from the mother substrate; adhere a support material to a lower face of the layered body; and divide the layered body along a face including a division line, wherein a slit pattern penetrating at least one of the plurality of inorganic insulating films is formed on the division line in a plan view, or outside a display region and inside the division line in a plan view.

Thirty-seventh aspect: A film formation device is included in a production device of a display device. The production device is configured to: form a TFT layer including a plurality of inorganic insulating films, a light emitting element layer, and a sealing layer above a mother substrate; adhere a protection material above the sealing layer; separate a layered body obtained by the processes from the mother substrate; adhere a support material to a lower face of the layered body; and divide the layered body along a face including a division line, the film formation device performs some of the processes, wherein a slit pattern penetrating at least one of the plurality of inorganic insulating films is formed on the division line in a plan view, or outside a display region and inside the division line in a plan view.

The disclosure is not limited to the embodiments stated above. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
4 TFT layer
5 Light emitting element layer

6 Sealing layer
10 Support material
12 Resin layer
16 Inorganic insulating film
18 Inorganic insulating film
20 Inorganic insulating film
21 Flattening film
24 EL layer
26 First inorganic sealing film
27 Organic sealing film
28 Second inorganic sealing film
50 Mother substrate
70 Display device production device
76 Film formation device
TM Terminal
NA Non-display region
DA Display region

The invention claimed is:

1. A display device comprising:
   a TFT layer including a plurality of inorganic insulating films, a light emitting element layer, and a sealing layer disposed above a support material, wherein
   a frame-shaped slit pattern, which penetrates at least one of the plurality of inorganic insulating films, and encircles a display region and inside edges of the support material, and
   the frame-shaped slit pattern penetrates all of the plurality of inorganic insulating films.

2. A display device comprising:
   a TFT layer including a plurality of inorganic insulating films, a light emitting element layer, and a sealing layer disposed above a support material, wherein
   a frame-shaped slit pattern, which penetrates at least one of the plurality of inorganic insulating films, and encircles a display region and inside edges of the support material,
   a barrier layer is included below the TFT layer, and
   the frame-shaped slit pattern penetrates the barrier layer.

3. The display device according to claim 1, wherein an inorganic sealing film is included in the sealing layer, and,
   in a plan view, edges of the inorganic sealing film are outside the display region and inside the frame-shaped slit pattern.

4. The display device according to claim 1, wherein an end face of the display device passes through the frame-shaped slit pattern.

5. The display device according to claim 1, wherein an end face of the display device passes through an outer side of the frame-shaped slit pattern.

6. The display device according to claim 2, wherein a resin layer is included below the barrier layer, and the slit pattern reaches as far as an upper face of the resin layer and does not penetrate the resin layer.

7. The display device according to claim 5, wherein one of a semiconductor film and a conductive film is provided overlapping with the frame-shaped slit pattern.

8. The display device according to claim 1, wherein the frame-shaped slit pattern is buried by an organic insulating film.

9. The display device according to claim 8, wherein at least a portion of the organic insulating film is constituted by an identical material to a bank that covers edges of a lower electrode of the light emitting element layer.

10. The display device according to claim 8, wherein at least a portion of the organic insulating film is constituted by an identical material to a flattening film that includes an underlayer of the light emitting element layer.

11. The display device according to claim 1, wherein the support material is one of a lower face film and a resin substrate.

12. The display device according to claim 1, wherein the frame-shaped slit pattern includes one of at least one groove-shaped slit and a plurality of island-shaped slits.

13. The display device according to claim 12, wherein the plurality of island-shaped slits are buried by the organic insulating film.

14. The display device according to claim 13, wherein one of the plurality of island-shaped slits and another one of the plurality of island-shaped slits are buried by separate island-shaped organic insulating films.

15. A display device comprising:
    a TFT layer;
    a light emitting element layer;
    a sealing layer; and
    a terminal, terminal wiring connected to the terminal, and a laser light absorbing film covering at least a portion of the terminal wiring provided in a non-display region;
    wherein at least a portion of the laser light absorbing film is formed by an identical material to a flattening film that includes an underlayer of the light emitting element layer.

16. The display device according to claim 15, wherein at least a portion of the laser light absorbing film is formed by an identical material to a bank that covers edges of a lower electrode of the light emitting element layer.

17. The display device according to claim 15, wherein the laser light absorbing film overlaps with an inorganic insulating film that is included in the TFT layer and is disposed above the terminal wiring.

18. The display device according to claim 15, wherein the laser light absorbing film overlaps with an inorganic sealing film included in the sealing layer.

19. The display device according to claim 15, wherein a laser ablation trace is formed on an upper face of the laser light absorbing film.

20. The display device according to claim 2, wherein an inorganic sealing film is included in the sealing layer, and
    in a plan view, edges of the inorganic sealing film are located outside the display region and inside the frame-shaped slit pattern.

* * * * *